United States Patent [19]

Glover et al.

[11] Patent Number: 4,846,699

[45] Date of Patent: Jul. 11, 1989

[54] POWER CONNECTOR SYSTEM FOR DAUGHTER CARDS IN CARD CAGES

[75] Inventors: Douglas W. Glover; Richard F. Granitz, both of Harrisburg; Donald R. Harner, Camp Hill, all of Pa.; Earl R. Kreinberg, Phoenix; Paul Vinson, Carefree, both of Ariz.; John W. Wanat, Duncannon; James P. Wolowicz, Harrisburg, both of Pa.

[73] Assignee: AMP Incorporated, Harrisburg, Pa.

[21] Appl. No.: 127,992

[22] Filed: Dec. 2, 1987

[51] Int. Cl.⁴ ............................................... H05K 1/14

[52] U.S. Cl. ...................................... 439/64; 439/157; 439/260

[58] Field of Search .............................. 439/55, 59–64, 439/79, 80, 259, 260, 266, 267, 152–160

[56] References Cited

U.S. PATENT DOCUMENTS

| | | | |
|---|---|---|---|
| T876,004 | 12/1969 | Andreini et al. | 439/157 |
| 3,368,117 | 2/1968 | Pond et al. | 361/415 |
| 3,470,522 | 9/1969 | Lawrence | 439/329 |
| 3,576,515 | 4/1971 | Frantz | 439/267 |
| 3,651,444 | 3/1972 | Desso et al. | 439/141 |
| 3,665,370 | 5/1972 | Hartmann | 439/260 |
| 3,725,843 | 4/1973 | Johnson | 439/507 |
| 3,767,974 | 10/1973 | Donovan, Jr. et al. | 439/64 |
| 3,793,609 | 2/1974 | McIver | 439/267 |
| 3,894,784 | 7/1975 | Clewes | 439/629 |
| 3,950,057 | 4/1976 | Calabro | 439/377 |
| 3,952,232 | 4/1976 | Coules | 439/155 |
| 3,977,747 | 8/1976 | Broutros | 439/267 |
| 4,042,289 | 8/1977 | Heinonen et al. | 439/629 |
| 4,064,551 | 12/1977 | Lightfoot | 439/155 |
| 4,072,379 | 2/1978 | Towne et al. | 439/65 |
| 4,164,362 | 8/1979 | Cobaugh et al. | 439/64 |
| 4,165,909 | 8/1979 | Yeager et al. | 439/260 |
| 4,189,200 | 2/1980 | Yeager et al. | 439/267 |

(List continued on next page.)

FOREIGN PATENT DOCUMENTS

| | | | |
|---|---|---|---|
| EPA0068195 | 1/1983 | European Pat. Off. . | |
| DEA2834728 | 2/1980 | Fed. Rep. of Germany . | |
| 3134278 | 8/1981 | Fed. Rep. of Germany | 439/79 |
| FRA2278222 | 2/1976 | France . | |
| 135437 | 5/1979 | German Democratic Rep. . | |
| 391810 | 9/1965 | Switzerland | 439/59 |

OTHER PUBLICATIONS

Electronic Engineers Master Catalog (EEM 86/87), 1986 Ed., C-1066; Hearst Business Communications, Inc., Garden City, N.Y.

(List continued on next page.)

*Primary Examiner*—Neil Abrams

*Attorney, Agent, or Firm*—Anton P. Ness

[57] ABSTRACT

A connector system for distributing power to daughter cards in a card cage includes a power connector for each card mounted on framework of the card cage. Each power connector has individual terminals connected to power conductors connected to a power supply and at least one terminal connected to a return path conductor. Each power connector includes a channel along which an active edge of the card is inserted and moved longitudinally from an open end, opposed from another channel aligned therewith, until the daughter card is fully inserted into the card cage, and signal transmission connectors along the back card edge mate with connectors of the backplane of the card cage. The daughter card is then locked in position; its power connector is then actuated, camming contact sections of its terminals into electrical engagement with contacts along the active edge of the daughter card. Each daughter card is thus powered and correspondingly disconnectable independently of the other daughter cards. An interference arrangement prevents the power connector from being actuated unless the card is locked in position, and prevents unlocking and removal of the card unless the power connector is deactuated. A dielectric rail along the card's active edge is shaped to fit the channel of the power connector and protect the active edge and contact sections therealong exposed in recesses of the rail. A daughter card may have two active edges, each with a rail insertable into channels of a pair of opposed power connectors.

18 Claims, 16 Drawing Sheets

U.S. PATENT DOCUMENTS

| | | | |
|---|---|---|---|
| 4,233,646 | 11/1980 | Leung et al. | 439/160 |
| 4,241,381 | 12/1980 | Cobaugh et al. | 439/61 |
| 4,261,631 | 4/1981 | Guilcher et al. | 439/260 |
| 4,313,150 | 1/1982 | Chu | 439/160 |
| 4,382,271 | 5/1983 | Villemont et al. | 439/206 |
| 4,480,884 | 11/1964 | Babuka et al. | 439/59 |
| 4,487,468 | 12/1984 | Fedder et al. | 439/325 |
| 4,498,722 | 2/1985 | Fedder et al. | 439/260 |
| 4,499,523 | 2/1985 | Gillett et al. | 439/155 |
| 4,517,625 | 5/1985 | Frink et al. | 439/266 |
| 4,518,210 | 5/1985 | Morrison | 439/260 |
| 4,572,604 | 2/1986 | Ammon et al. | 439/633 |
| 4,592,610 | 6/1986 | Bowls | 439/377 |
| 4,603,928 | 8/1986 | Evans | 439/61 |
| 4,655,518 | 4/1987 | Johnson et al. | 439/62 |
| 4,682,834 | 7/1987 | Dunn et al. | 439/267 |
| 4,716,495 | 12/1987 | Craker | 439/327 |

OTHER PUBLICATIONS

AMP Publication, "Intercard Connection Without Backplanes," Cabaugh and A. Taylor, May, 1977; AMP Inc., Harrisburg, PA.

AMP Catalog 81-655, "AMP-HDI 2-piece Pc Board Connectors," Revised 3-86, p. 43 (1986); AMP Inc., Harrisburg, PA.

AMP Data Sheet 74-279, "TERMI-FOIL Terminals and Splices," Issued 7-84, pp. 1-3 (1984); AMP Inc., Harrisburg, PA.

AMP Data Sheet 82-685, "Ultra-Fast Plus--Fully Insulated FASTON Receptacles," Revised 5-84, pp. 1-2 (1984); AMP Inc., Harrisburg, PA.

AMP Data Sheet 75-357, "Ultra-Fast Fully Insulated FASTON Receptacle and Tab," Revised 4-82, pp. 1-4 (1982); AMP Inc., Harrisburg, PA.

300
302
304
306
308
310
312
314
316
318
320
322
324
326
328
330
334
336
346
352
358
360
362
364
368
372
374
376
378
378'
380
380'
382
384
386
390
396
398
402
408
410
412

POWER CONNECTOR SYSTEM FOR DAUGHTER CARDS IN CARD CAGES

FIELD OF THE INVENTION

The present invention is related to the field of electrical connectors, and more particularly to connectors for providing power to circuit panels.

BACKGROUND OF THE INVENTION

Card cages are known which comprise a framework within which a plurality of circuit panels or daughter cards are insertable, and within which is disposed a backplane transverse to the back edges of the daughter cards. The cards are electrically connected to the backplane by any of several types of known connectors and terminals, and are interconnected by the backplane to each other and to other electrical components on the opposite side of the backplane. Each daughter card in conventional card cages also receives all necessary power for its components from the backplane through a plurality of terminals. One typical method involves providing a multilayer backplane having power-carrying circuit paths embedded within it, involving significant fabrication expense, to which terminals are engaged to transmit the power at current levels ordinarily about one ampere per terminal through connectors to the daughter card. Connectors which must house the quite numerous power-carrying terminals also must house signal terminals for the primary purpose of providing signal transmission to and from the daughter cards; signal terminals are thus limnited in number and in their position, which in turn limits the capabilities of the daughter cards. Also, the current levels presently available limit the number and types of components usable with the daughter cards.

Another feature of conventional card cages is that the power is provided to the backplane from power conductor cables from outside the card cage, and the transmission of power into the card cage is usually controlled by one switch. In such card cages transmission of power to the individual daughter cards is not controlled on a card-by-card basis and in fact power to all the cards is either all ON or all OFF. Therefore, power to all cards must be turned off to permit insertion or removal of an individual daughter card, resulting in undesirable levels of down time.

Multilayering of daughter cards is presently done to transmit power received along the back edge by numerous power terminals, to interior regions of the daughter card in order to avoid interfering with the increasing number and the positioning of signal circuit paths desired, in an effort to enhance the capabilities of daughter cards, given the limitation of back edge power reception in present day card cages. Multilayering of daughter cards, as with multilayering of backplanes, is costly.

It would be desirable to provide power to daughter cards of a card cage by means other than terminals electrically connected to the backplane, allowing substantial cost savings in backplane manufacturing.

It would be desirable to introduce the power to the daughter cards other than along the back edge, thus allowing the connectors along the back edge to be devoted to signal transmission and increase the number of signal transmission connections to the backplane.

It would be desirable to provide power distributed along edge surfaces other than the back edge, without interfering with the ability of the daughter card to be easily inserted and withdrawn from the card cage.

It would be desirable to provide power at current levels higher than is presently available to individual power paths of the daughter card, and to provide a higher total power to the card.

It would further be desirable to provide power to each daughter card individually, and to shut off power individually, to minimize down time of the entire card cage.

It would additionally be desirable to provide a means for assuring that the provision of power to an individual daughter card occurs only after the card has been fully inserted into its proper seated position within the card cage and locked therein, to prevent substantial damage and destruction to a card or its components such as integrated circuit packages, by premature powering.

It would yet be desirable to provide a connector and corresponding card edge construction for providing power distributed therealong by individual power conductor means connected to a power supply, to allow for repair or replacement of the power conductor means and also to allow for different selected current levels at specific locations along the edge of the daughter card.

Also, it would be desirable to provide a card cage with power connectors mounted therein as an assembly, to be electrically connected later as desired with respective daughter cards from various sources of manufacture, and various thicknesses and various configurations of circuit paths for conducting power to the interior regions of the card's surface.

Additionally, it would be desirable to provide an array of power connectors in a card cage for respective daughter cards, in a manner which does not inhibit or complicate the procedure for the insertion or withdrawal of the daughter card from the cage.

SUMMARY OF THE INVENTION

The present invention is a system of electrical connectors for distributing power to side edges of daughter cards inserted into a card cage, where the power connectors are mounted to framework of the card cage in opposed pairs. Each power connector has a channel, and each daughter card is insertable into the card cage laterally along opposed channels of the opposed connectors. Contact sections along the side edge of the daughter card are portions of power bus paths extending into the interior regions of the side surfaces of the card to electrical components to be powered. Individual terminals in the power connector correspond to the card contact sections and contact ends on cantilever beams thereof are disposed along the channel to be cammed into electrical engagement with the card contact sections by a camming system of the power connector. Other ends of the connector terminals are exposed to be electrically engaged with corresponding terminals of power conductors connected to a power supply within the card cage. The back edge of the daughter card is thus reserved for signal transmission to and from a backplane of the card cage by means of connectors along the back edge and backplane.

According to another aspect of the present invention, the daughter cards include a mechanism for securing the card in position after full insertion into the card cage, which is adapted to cooperate with the cam's actuator of the power connector to prevent the actuator from being actuated whenever the card is not secured in place. A portion of the actuator must follow a path which intersects a path of a portion of the mechanism so that when the mechanism portion is not in a secured position, it interferes with and obstructs the path which the actuator portion must follow during actuation. Conversely, the actuator in its actuated position obstructs the path which must be followed by the mechanism portion to unlock and eject the daughter card from the card cage. Also, the actuator may be disposed across the open end of the card-receiving channel in its actuated position, preventing insertion of a card thereinto until the actuator is moved to the deactuated position, thus assuring that the terminal cantilever ends have been moved out of the channel.

The present invention also includes assembling a rail member along the active side edge of the daughter card, to follow along the channel of the power connector. The card contact sections are disposed within recesses of the rail in a manner exposing them for engagement by the terminals of the power connector. While the width of the rail is manufactured to correspond to a standardized width of the channels of the power connectors, it includes an edge-receiving groove whose width is manufactured to correspond to the thickness of the daughter card to which it will be secured, which thicknesses vary from card to card according to its source of manufacture. This allows a single size of power connector to accommodate a range of thicknesses of daughter cards in order to standardize the card cage assembly generally independently of the manufacture of the daughter cards.

It is an objective of the present invention to provide a connector system for distributing power along a side edge of a daughter card instead of via the backplane of the card cage and back edge of the card, allowing the back edge to be freed for signal transmission exclusively.

It is also an objective to provide power to each daughter card independently of the powering of the other daughter cards in the card cage, and conversely to independently shut off power to the card, thus performing a switching function.

It is a further objective to provide such a connector which enables insertion and withdrawal of a card freely from the card cage.

It is another objective to provide a means of assuring that a daughter card is secured in its fully inserted position before any power is able to be provided to any portion of the card, and to assure that all power is shut off to the card before it can be unlocked and removed from the card cage.

It is yet another objective of the present invention to provide a connector which can provide power at current levels of the range of about ten amperes to individual contact sections of a daughter card within a card cage.

DETAILED DESCRIPTION OF THE PREFERRED EMBODIMENTS

Figure 1:
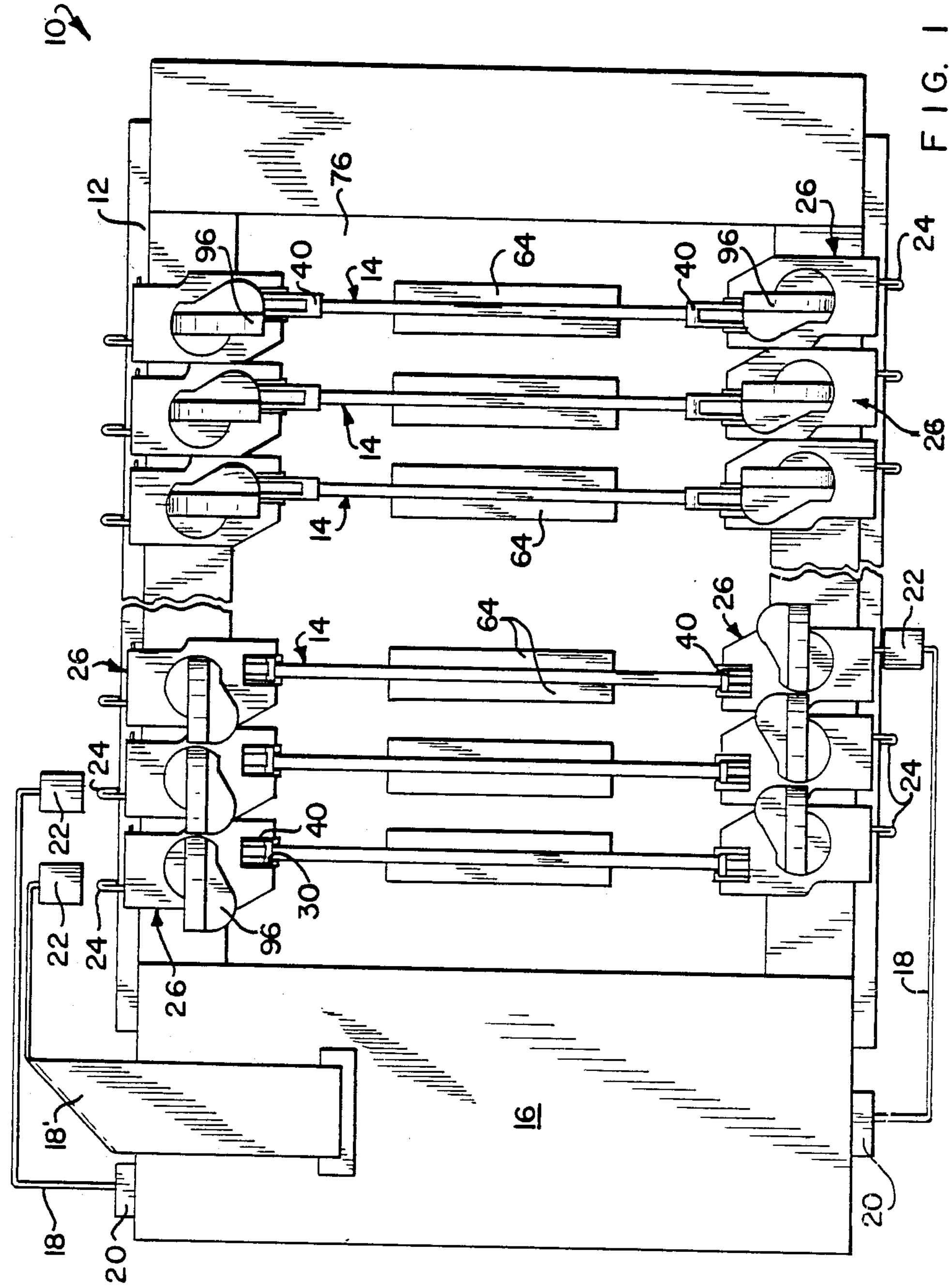
FIG. 1 is an elevation view of a card cage having a plurality of circuit cards therein of the present invention, each disposed between and mated with a pair of edge guide power connectors of the present invention connected to a power source, with the cards on the right being locked in place and the power connectors actuated.

FIG. 1 shows a card cage 10 including a frame 12 having a plurality of representative daughter circuit cards 14 inserted thereinto from the open front, and which may be removed therefrom. Cards 14 receive power for electrical components 64 mounted thereon from a power supply 16 also insertable into and removable from the card cage, by means of a plurality of power cables 18. Each cable 18 is electrically connected by first terminal means 20 to corresponding terminal means (not shown) of the power supply, and is terminated by second terminal means 22 for electrical engagement with one or more of a plurality of terminals 24 spaced along an edge guide power connector 26 corresponding to an active edge of a daughter card 14. At least one return path conductor 18' is also provided and connected to the power supply 16. Preferably the plurality of edge guide power connectors 26 are secured to the card cage frame 12 in spaced parallel arrays along the top and bottom of the card-receiving area of the card cage. Such a card cage system is disclosed in more particularity in U.S. patent application Ser. No. 07/128,000 Dec. 2, 1987, filed and assigned to the assignee hereof. A flexible power distribution system particularly useful with such a card cage system is described in greater particularity in U.S. patent application Ser. No. 07/050,793 filed June 22, 1987 and assigned to the assignee hereof, although conventional power conductor wires may be used.

Figure 2:
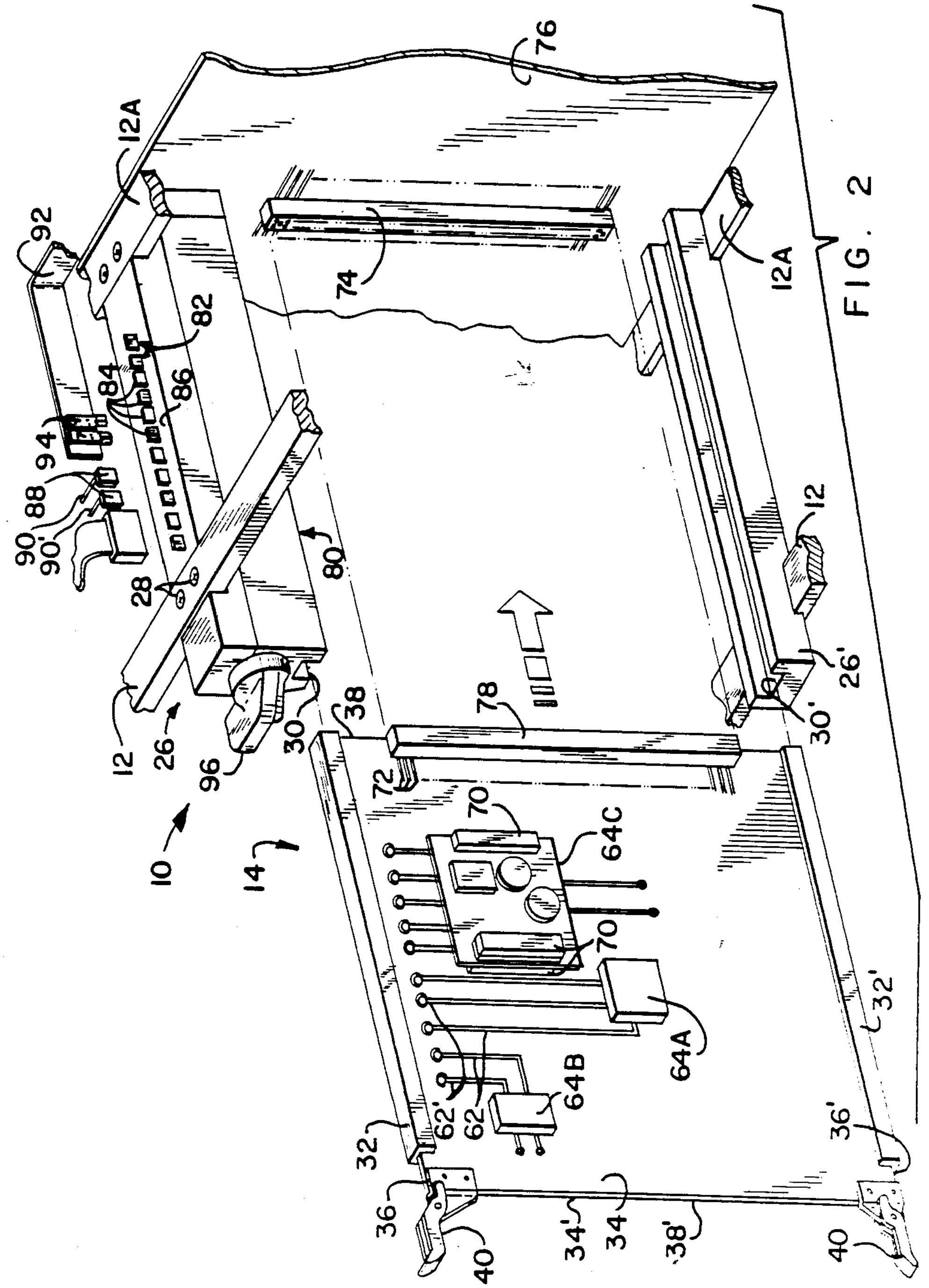
FIG. 2 is a perspective view of a daughter card exploded from its position in the card cage of FIG. 1 and from between an edge guide power connector of the present invention and an opposing channel member.

Referring to FIG. 2, edge guide power connector 26 is mounted to card cage frame 12,12A such as by pairs of fasteners 28 at each end of the connector. Each power connector 26 includes a card-receiving channel 30 within which is receivable a rail 32 secured to an active edge of a daughter circuit card 14 extending from a leading edge to a trailing edge of the card relative to card cage insertion thereof. Channel 30 preferably has rectilinear side wall and bottom channel-defining surfaces, and rail 32 correspondingly preferably has rectilinear top and side surfaces, which surfaces are raised above the surface portions of the active edge on all three sides and will undergo at least incidental bearing engagement during insertion and withdrawal of card 14 into and out of the card cage. Preferably the front end of channel 30 and the rearward end of rail 32 include tapered corners for lead-in purposes facilitating lateral insertion.

Each daughter card has two major side surfaces 34,34', top and bottom edges 36,36', and back and forward edges 38,38'. In a typical card cage 10 top and bottom edges 36,36' of each daughter card 14 may be active edges, and each active edge will have a respective rail 32 so that card 14 can be inserted into the card cage frame from a card-receiving face thereof within aligned and opposing channels 30 of a pair of opposed power connectors 26. However, it is foreseeable that one or more daughter cards 14 may only have one active edge for the receipt of power and with such a card the edge opposed from the active edge preferably will still have a rail such as rail 32' and be received along a channel 30 of an inactive power connector or dummy member 26' having a card-receiving channel 30', or even a channel of the card cage frame 12 itself.

Figure 2A:
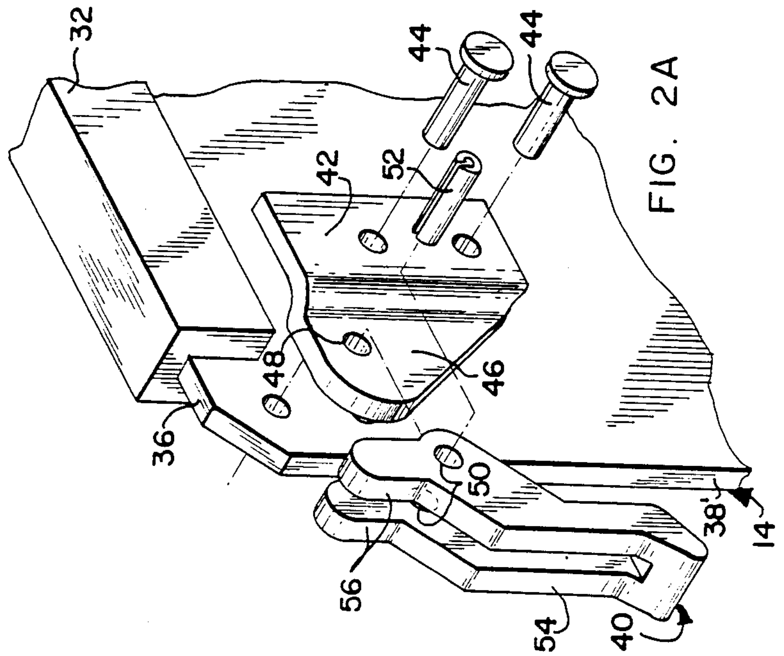
FIG. 2A is an enlarged exploded view of one of the insertion/ejection members of the daughter card of FIG. 2.

Each daughter card 14, once fully inserted into opposed channels 30,30 (or 30,30') therefor, is then secured therein by insertion/ejection members 40 (FIG. 2A) which have locking means cooperable with corresponding locking means of the power connectors 26 (or of the dummy connector 26'). Insertion/ejection members which also serve to eject the daughter card partially from the card cage are conventionally known. In FIG. 2A insertion/ejection member 40 is pivotably securable to card 14. Mounting plate 42 is fastened to a corner of card 14 along top edge 36 at front edge 38' using rivets 44, for example. Flange 46 includes a pivot hole 48, and pivot holes 50 of bifurcated insertion/ejection member 40 are aligned therewith on both sides, after which roll pin 52 is inserted through holes 50,48,50. Pin 52 enables pivoting of hand-grippable portion 54 between a secured position as shown and an unlocked position wherein hand-grippable portion 54 extends perpendicularly outwardly from front edge 38'. Protrusions 56 will enter a corresponding cavity of power connector 26 in order to secure the card, after full insertion of card 14 into the card cage.

Figure 3:
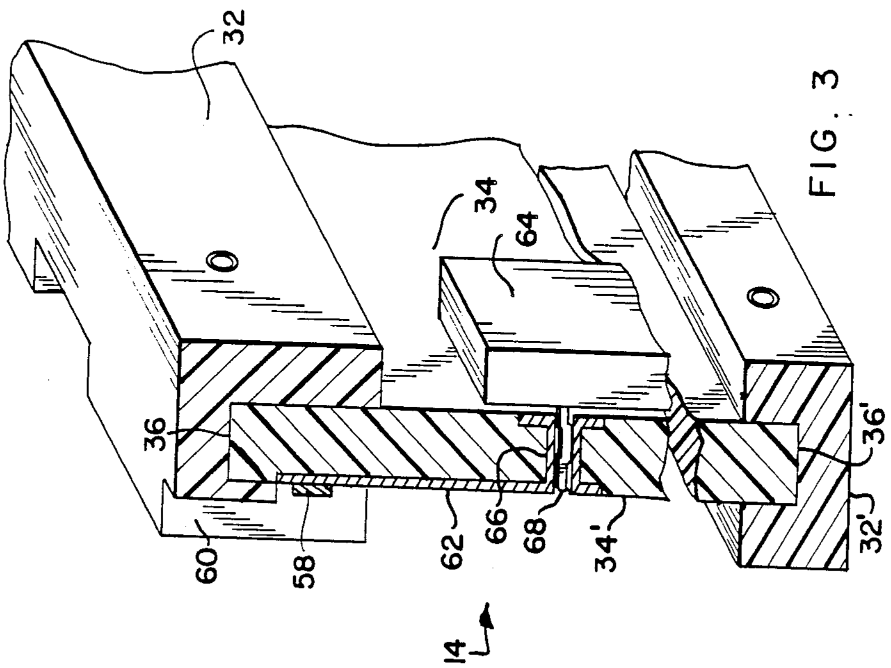
FIG. 3 is an enlarged part section view of a daughter card of FIG. 2 showing a power circuit path extending to a component mounted on the opposite side of the card.

After card 14 is secured in position an actuator 96 of connector 26 is moved to an actuating position, which cams the plurality of terminals into electrical engagement with corresponding contact means 58 of the daughter card at power-receiving locations spaced along the active edge and exposed in recesses 60 of rail 32 shown in FIG. 3. For appropriate electrical engagement to conduct the levels of power being transmitted to daughter card 14 such as ten amperes or greater at each contact location for long in-service use, contact means 58 preferably comprise buttons of low resistance silver or silver alloy fastened such as by soldering or by inlaying onto circuit paths 62 which extend to terminals (such as pin terminals 68 shown in FIG. 3) of components 64 to be powered, or they may be end portions of circuit paths 62 themselves. Corresponding return paths 62' extend back to the active edge of daughter card 14 to be similarly connected to a return path conductor 18'. Alternatively return paths 62' may be commoned to one return path on the daughter card with one contact section along the active edge for electrical connection to one return path conductor via one return terminal of the power connector.

As seen in FIG. 3, components 64 can be mounted on either major side surface 34 or 34' of card 14, irrespective of which side surface circuit paths 62 are disposed along, through the use of conductive plated through-holes 66 electrically connectd to the circuit paths and of component terminals such as those with pin sections 68 having compliant sections adapted to self-secure within plated through-holes in electrical engagement therewith after being inserted therein, both of which are conventionally known and may be used. Because of such capability, it is possible and preferable to place contact sections 58 along a common side of the active edge which simplifies the construction of edge guide power connectors 26. It is also possible to place power circuit paths 62 on one major side surface such as 34', allowing the other major side surface 34 to be devoted to signal circuit paths such as signal paths 72 along back edge 38.

Components 64 foreseeably usable with circuit panels 14 in a card cage can be, for instance, integrated circuit packages 64A, transistors, solid state components, and also LEDs such as LED 64B placed near front edge 38' for visual indication of a POWER ON state of the daughter card. As is disclosed in Ser. No. 07/128,000, smaller circuit cards or baby boards 64C can be in turn mounted onto the daughter card and have components to be powered by the card, with electrical engagement established using, for example, stacking connectors 70 such as AMP HDI connectors sold by AMP Incorporated, Harrisburg, Pa.

Upon actuation of edge guide power connector 26, daughter card 14 and its components 64 will be powered. With power being brought to the card from the top edge 36 or both the top and bottom edges 36,36', back edge 38 of the card with its premium real estate can be devoted to the electrical connection of signal paths 72 of the card to corresponding contact means of connectors 74 mounted on backplane 76 of card cage 10, upon full insertion of card 14 in the card cage. Backplane 76 is also a circuit panel as are daughter cards 14 and is secured to the framework of the card cage to be orthogonally disposed adjacent and transverse with respect to back edges 38 of all the daughter cards 14 inserted into the card cage. Connectors 74 mounted on backplane 76 have terminals electrically connected to respective circuit paths of the backplane which interconnect corresponding contacts of connectors 78 such as AMP HDI connectors, of the various daughter cards mounted on back edges 38 thereof. Backplane 76 can also have pin or post arrays (not shown) to permit conventional wire wrapping to achieve electrical interconnection. Backplane 76 can also provide for electrical connection of terminals of connectors 78 with corresponding contact means of components or other circuit boards (not shown) mounted in card cage 10 behind backplane 76, such as is conventionally known. With the backplane freed of the duty of transmitting power to the daughter cards as has been conventional, and providing for signal transmission to and from the daughter cards for communication therebetween, much greater card cage utility is provided than has been known prior to the present invention.

Also shown in FIG. 2 edge guide power connector 26 comprises a dielectric housing assembly 80 including channel 30 into which rail 32 along an active edge of the daughter card will be inserted. Housing assembly 80 also includes a plurality of terminals 82 firmly mounted therewithin along the top portion and having a first contact section 84 for electrical connection to a terminal means of a power cable means connected to power supply 16. Preferably first contact section 84 is blade-like and extends from top surface or cable face 86 of housing assembly 80 to be engaged by a corresponding receptacle terminal secured to a power conductor electrically connected to power supply 16, as shown in FIG. 1.

Each edge guide power connector 26 has an actuator 96 which is actuatable to power the associated daughter card independently of the other daughter cards in the card cage, and as such represents a singular major advance in card cages. Also each power connector 26 can be independently deactuated to permit removal of its daughter card for repair or replacement, while all other cards remain fully powered and functioning.

Terminals 88 connected to conventional power and return conductors 90,90' can be for instance the fully insulated receptacle type sold under the trade designation Ultra-Fast FASTON by AMP Incorporated, Harrisburg, Pa. A preferred power conductor is a flexible flat power cable 92, such as the cable disclosed in U.S. patent application Ser. No. 07/050,793, using for example terminals 94 which are terminatable to flat conductor cable in a manner similar to that utilized by terminals sold under the trademark TERMI-FOIL by AMP Incorporated, and using an appropriate blade-matable receptacle structure similar to the FASTON terminals. The power conductor terminals may preferably be removable from first contact sections 84 enabling repair or replacement of a terminal or of the power cable. Each terminal 82 of the edge guide power connector further includes a cantilever portion extending therefrom to a free end on which is disposed a second contact section (not shown) which is cammed into electrical engagement with a contact means 58 of the daughter card by a camming means extending through housing assembly 80, upon actuation thereof by rotary movement of actuator 96.

In the first embodiment 100 of edge guide power connector shown in FIGS. 4 to 9, the housing, the camming means, and the terminals are all adapted for rotary camming movement, as disclosed in U.S. patent application Ser. No. 07/127,747 filed Dec. 2, 1987 and assigned to the assignee hereof. Power connector assembly 100 includes a dielectric housing 102 and a cylindrical cam shaft 104 extending through and secured in a corresponding cylindrical cam-receiving aperture 106 extending along housing 102. Secured onto the forward end of cam shaft 104 is actuator member 108 which is reciprocally from an unactuated position to an actuated position to rotate cam shaft 104. A plurality of terminals 110 are secured in housing 102 to transmit power from the power conductors to the active edge of the daughter card in a distributed manner. First contact sections 112 of terminals 110 are exposed along cable face 114 for electrical connection with contact means of the power conductor means, and can comprise blade sections extending upwardly to receive therearound appropriate receptacle contact sections of the power conductors. Second contact sections 116 of terminals 110 are disposed along card-receiving channel 118 for engagement with contact means 58 of daughter card 14 upon actuation of edge guide power connector 100. Terminals 110 preferably are disposed in a single row, with second contact sections 116 thereof also disposed in a single row along one side of card-receiving channel 118 preferably to engage contact means 58 of daughter card 14 along a common side of the active edge of the card.

Figure 4:
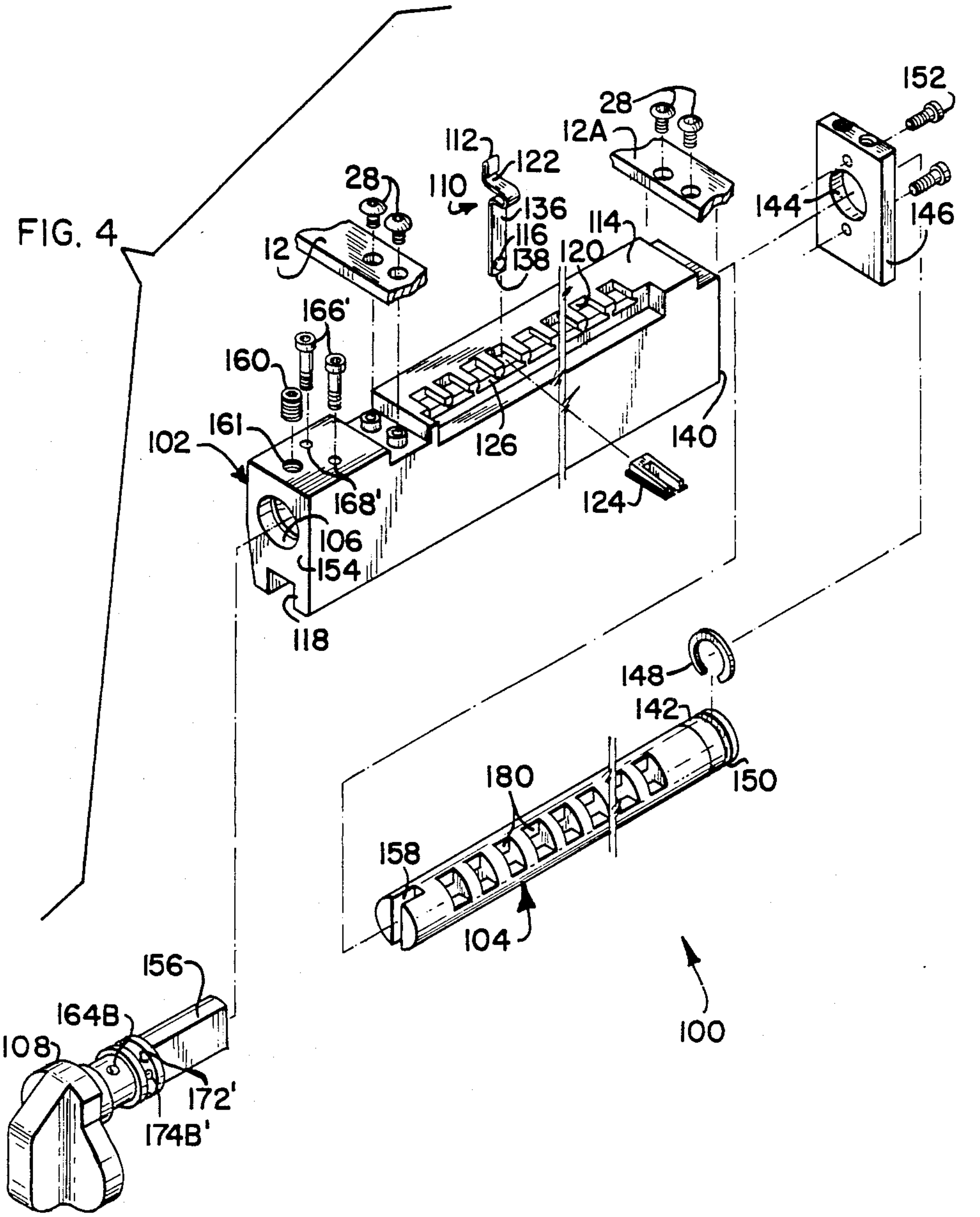
FIG. 4 is an exploded view of an edge guide power connector of the present invention, showing the cam shaft and mounting block, the actuator, a terminal and mounting member, and card cage frame sections.
Figure 5:
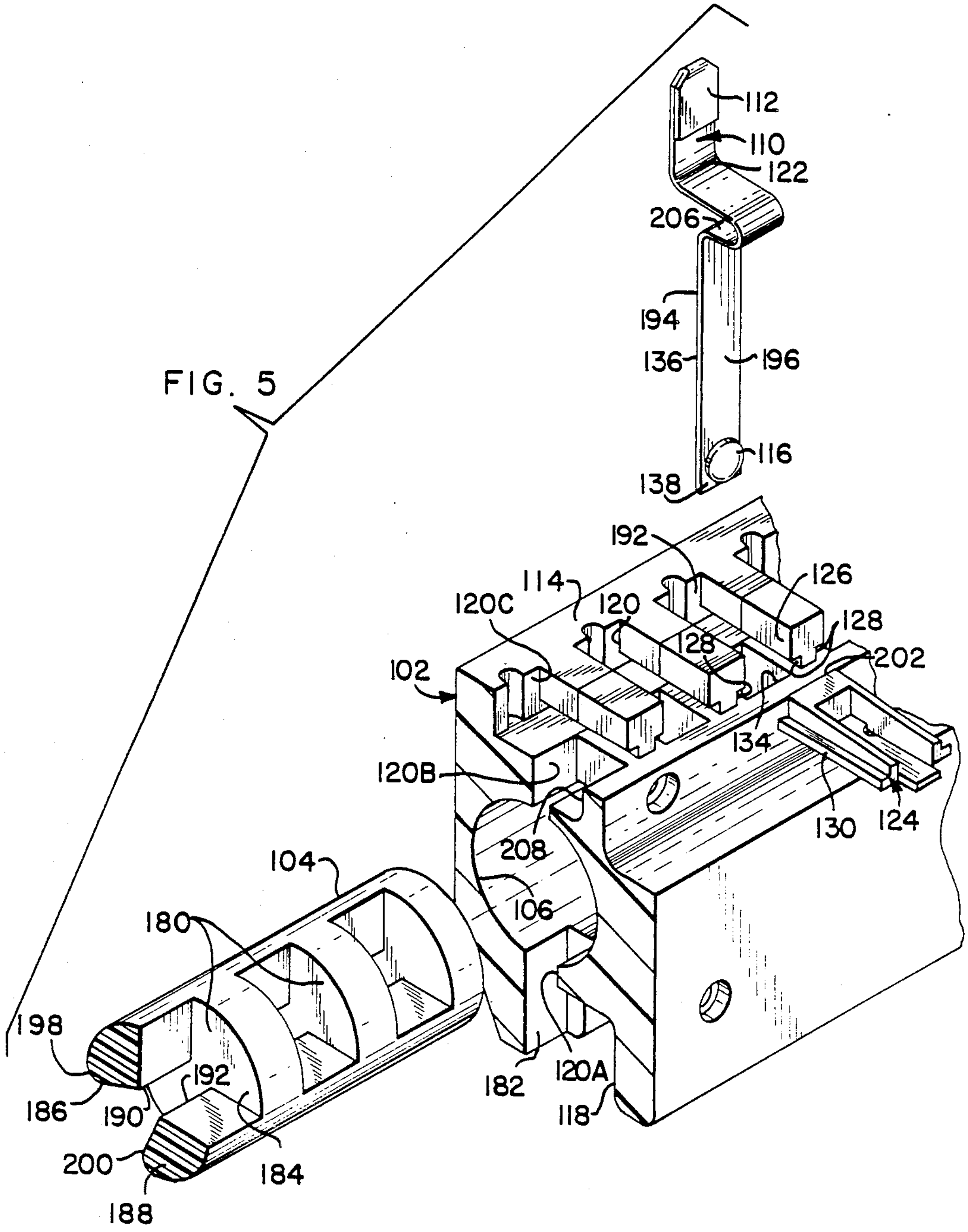
FIG. 5 is an enlarged perspective view of a section of the connector of FIG. 4 showing a section of the cam shaft and a terminal and its mounting member exploded from the connector housing.

Referring to FIGS. 4 and 5, terminals 110 are securable in respective terminal-receiving passageways 120 which have first portions 120A in communication with card-receiving channel 118 and second portions 120B which are in communication with cam-receiving aperture 106. Terminals 110 include mounting portions 122 along the cable face 114 of connector 100 and secured in third passageway portions 120C such as by mounting members 124 received into mounting member recesses 126 of housing 102 which are profiled to provide opposed channels 128 to receive flanges 130 of members 124 therealong. Mounting members 124 are secured in recesses 126 such as by latches 132 (FIG. 9) engaging stop surfaces 134 of recesses 126. Cantilever portions 136 depend from mounting portions 122 and conclude in free ends 138 on which are disposed second contact sections 116.

Figure 6:
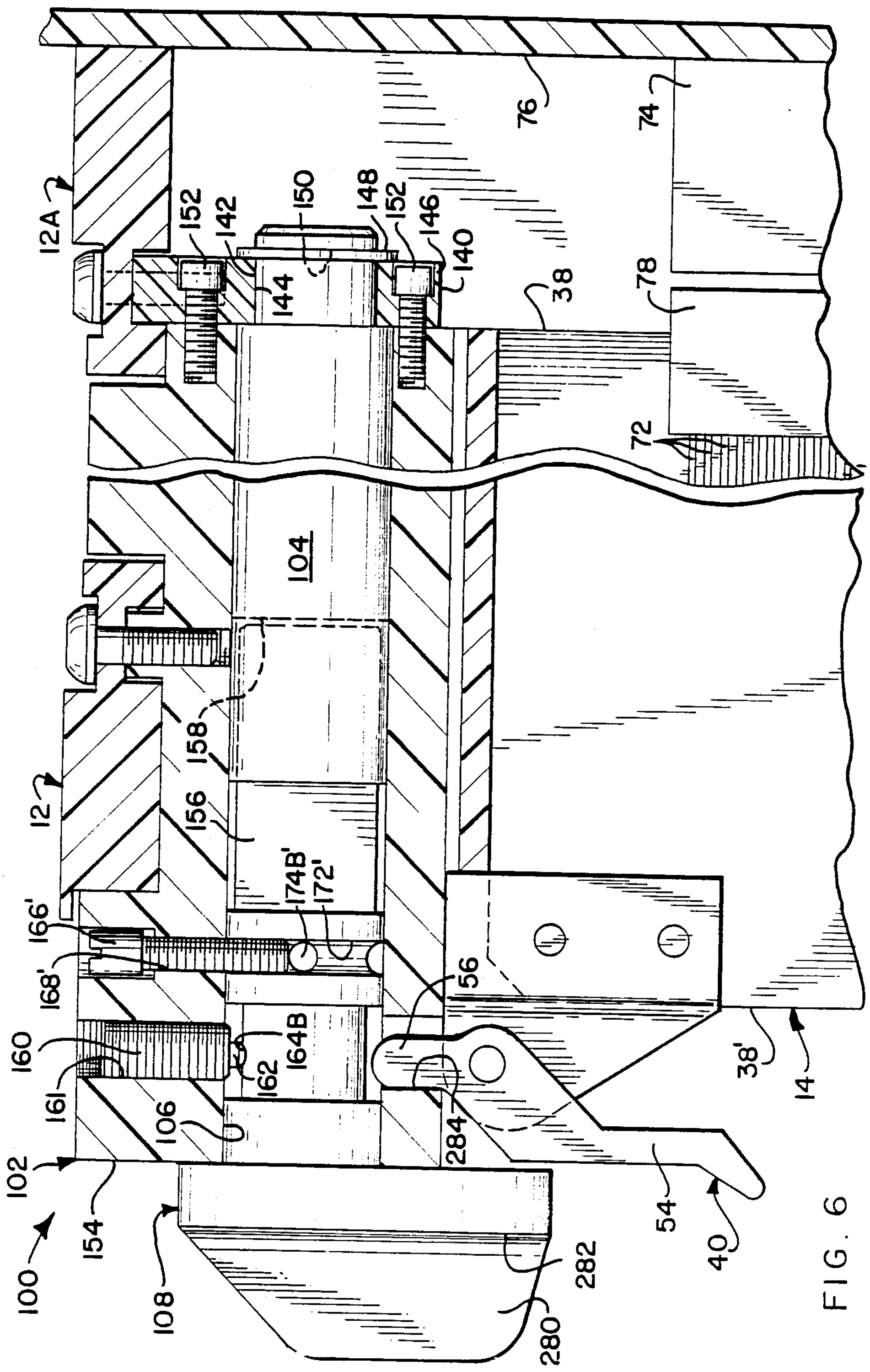
FIGS. 6 and 7 are part longitudinal section views of a daughter card in the connector showing the insertion/ejection member of the card and the cam actuator of the power connector.

During assembly, with reference to FIGS. 4 to 7, cam shaft 104 is inserted into cam-receiving aperture 106 from rearward end 140 of housing 102. Smaller diameter portion 142 extends from rearward housing end 140 into a corresponding hole 144 of mounting block 146 after which a lock ring 148 is snapped around cam portion 142 in an annular groove 150. Mounting block 146 is then fastened to housing end 140 by screws 152, securing cam shaft 104 within housing 102. Hole 144 of mounting block 146 is closely dimensioned to just permit cam shaft 104 to be rotated therewithin. As can be seen in FIG. 6, a rearward frame portion 12A can abut backplane 76 to precisely locate power connector 100 such that the mating pair of signal connectors 78,76 have just enough clearance to mate properly when card 14 is locked in position. Frame 12A can also assure that rearward end of power connector 100 is aligned with respect to connector 76 that its card-receiving channel 118 brings back edge 38 of card 14 and connector 78 into precise alignment with connector 76 upon insertion.

Completing the assembly of connector 100, actuator member 108 is then inserted into aperture 106 from housing forward end 154 so that projection 156 is disposed in slot 158 at the forward end of cam shaft 104. Spring loaded detent assembly 160 is threadedly secured in hole 161 so that detent 162 can be received into a first cavity 164A defining a first or unactuated position placed at one angular position about actuator member 108, a second cavity 164B defining a second or actuated position spaced angularly preferably 90 degrees from first cavity 164A, and a third cavity 164C midway therebetween may define a cam shaft position enabling assembly of terminals 110 into power connector 100.

Figure 4B:
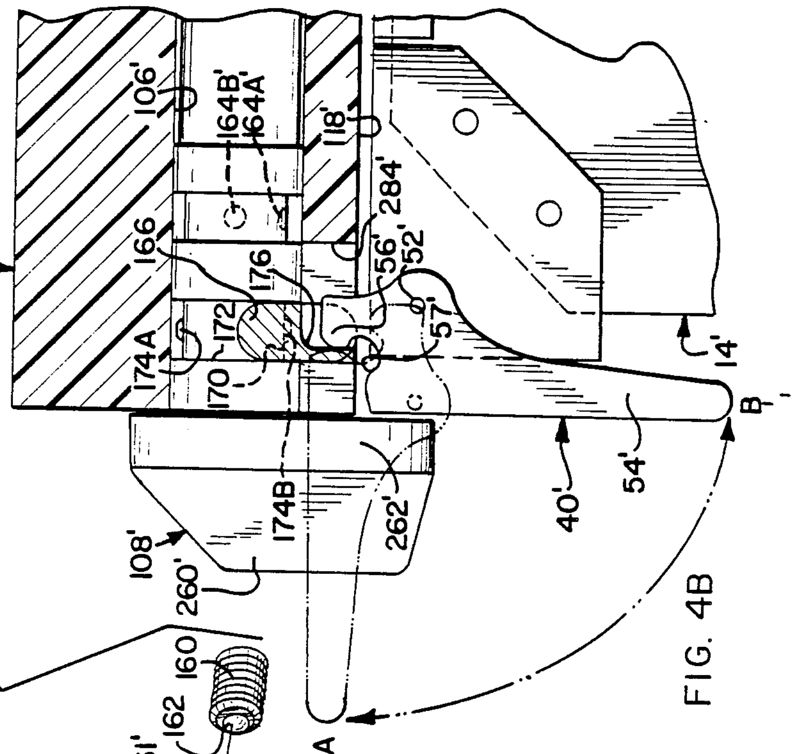
FIG. 4B is a part longitudinal section view showing another insertion/ejection member for use with the retention key of FIG. 4A, in the secured position, with the unsecured position shown in phantom.
Figure 4A:
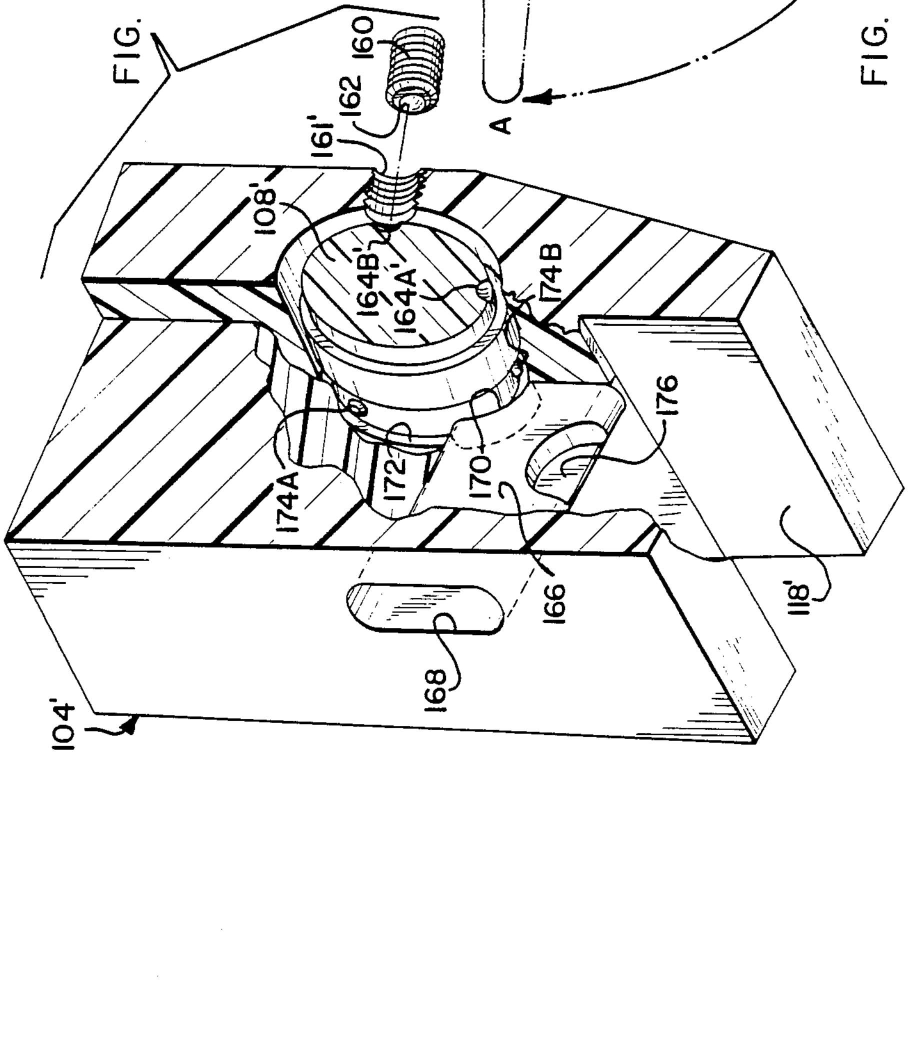
FIG. 4A is an enlarged part section view of another cam actuator and retention key therefor.
Figure 7:
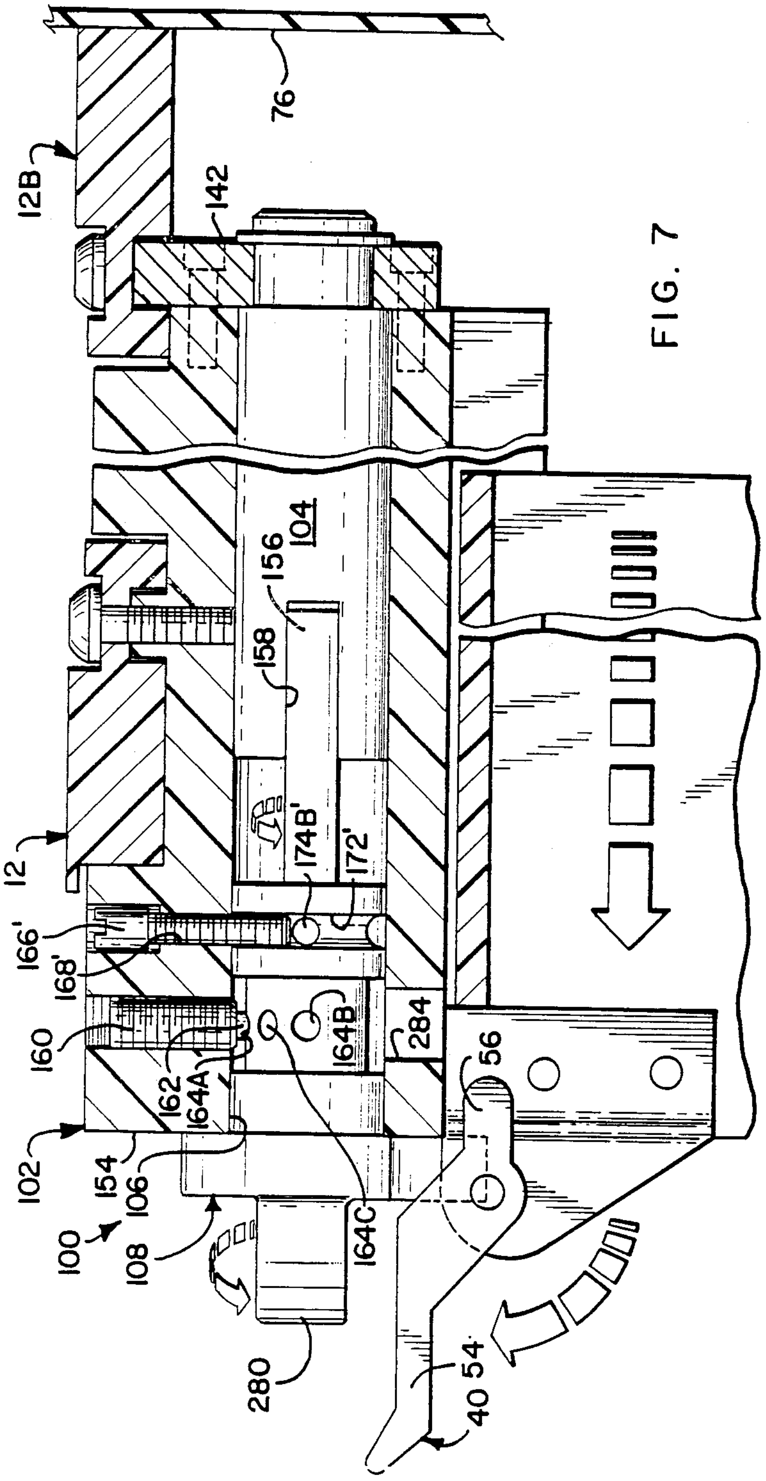

Actuator member 108 is shown in FIGS. 4, 6 and 7 secured in aperture 106 by a pair of set screws 166' threaded into laterally offset holes in housing 102, each with a shank disposed alongside actuator member 108 in an annular recess 172'. Alternatively, as shown in FIGS. 4A and 4B, actuator member 108' may be secured in aperture 106' of housing member 104' by a key member 166 force-fitted into slot 168 of housing member 104' in communication with aperture 106'. Corner 170 of key member 166 is inversely radiussed to fit within a corresponding annular recess 172 of actuator member 108' upon assembly, which restrains the actuator from axial movement along aperture 106', keeping it secured in the housing. Projections 174A,174B within annular recess 172 are positioned to abut sides of key member 166 when actuator member 108' has been rotated to either an unactuated position or an actuated position to prevent over-rotation. Similarly, projections 174A',174B' can be used with the set screw securing method of FIGS. 4, 6 and 7.

Referring to FIG. 4B, a plate portion 176 of key member 166 depends relatively from key member into a cavity 284' of housing member 104'. Cavity 284' extends upwardly from the bottom surface of card-receiving channel 118' to communicate with slot 168 within which key member 166 is disposed. Plate portion 176 is positioned to be engaged by insertion/ejection member 40' after insertion of daughter card 14' into channel 118' in order to enable member 40' to secure card 14' in the card cage, and to enable member 40' to be manipulated to eject card 14' from the card cage for removal. Projection 56' of member 40' engages behind plate portion 176; as lever portion 54' is continued to be rotated downwardly about pivot 52' from position A to position B, projection 56' is relatively pushed rearwardly by plate portion 176 to urge card 14' completely into its fully inserted position. When it is desired to withdraw card 14' from the card cage, member 40' is rotated upwardly and anvil portion 57' engages the front surface of plate portion 176 and is pushed relatively forwardly to move card 14' slightly forwardly in ejection allowing card 14' then to be pulled completely out of the card cage. This insertion and ejection action serves to facilitate the mating and unmating of connectors 78 along the back edge 38 of the card with connectors 74 mounted on the backplane 76 as shown in FIGS. 2 and 6. Such an insertion/ejection member 40' is sold by Calmark, Inc.

Figure 8:
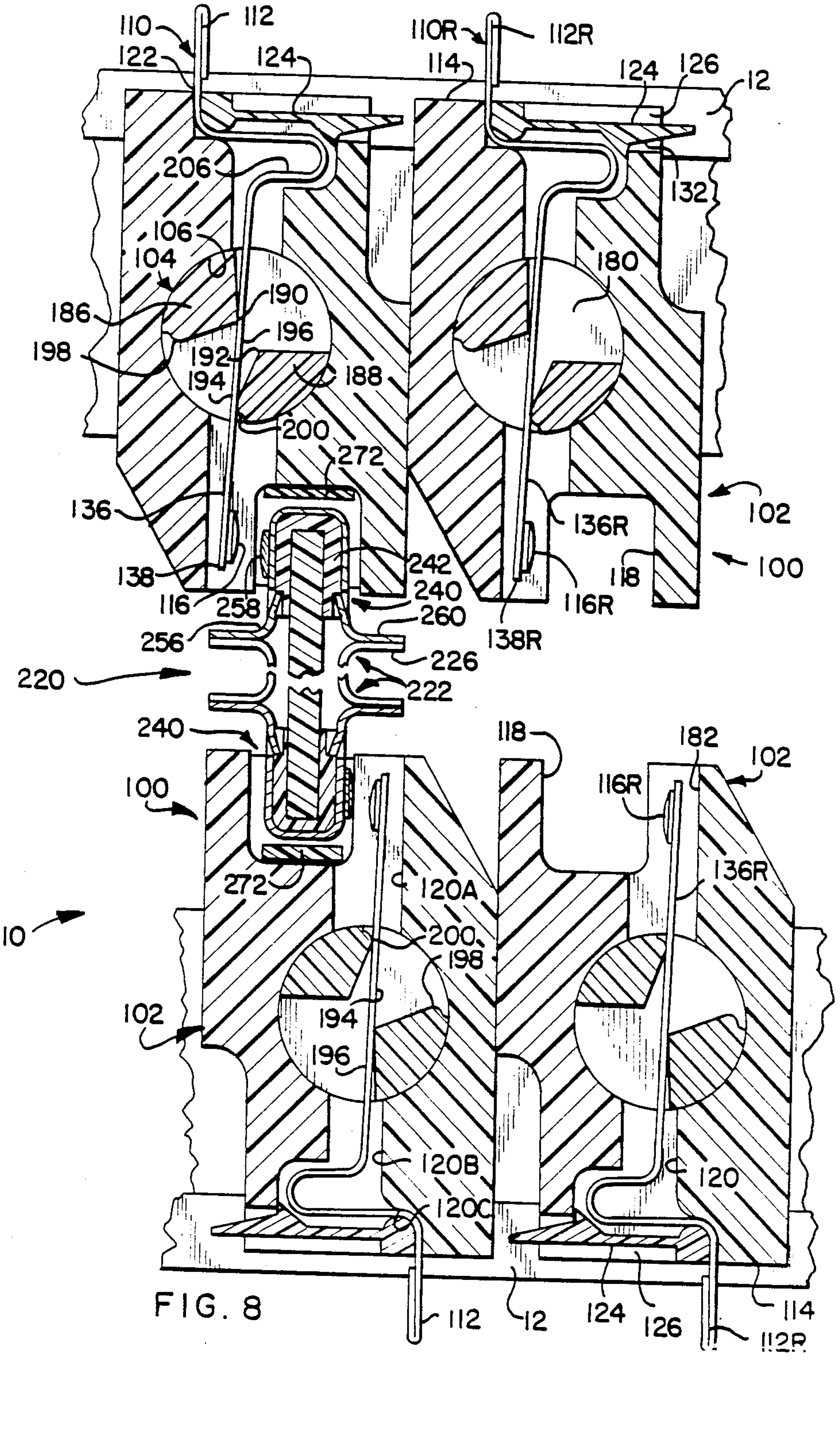
FIG. 8 is an enlarged cross-sectional view of a daughter card disposed in the guide channels of a pair of power connectors to be mated, and an adjacent pair of empty power connectors therebeside showing return terminals therein.

Projection 156 of actuator member 108 rotates cam shaft 104 when actuator 108 is itself rotated (FIG. 7). Terminals 110 are assembled into respective terminal-receiving apertures 120 of the housing preferably when actuator member 108 is in a position midway between the unactuated and actuated positions. Cantilever portions 136 are inserted into apertures 120 and through respective profiled apertures 180 of cam shaft 104 so that free ends 138 and second contact sections 116 thereon extend past the other side of cam shaft 104 through passageway portions 120A and along recesses 182 aligned with apertures 180 and spaced along card-receiving channel 118, as seen in FIG. 8. Then mounting members 124 are placed into recesses 126 to secure terminals 110 in place, completing the assembly of connector 100.

As shown in FIGS. 5 and 8, each profiled aperture 180 is preferably defined by opposed transverse side surfaces 184 and generally inwardly facing surfaces of opposed triangular lands 186,188 having respective apices 190,192 proximate to but spaced from each other near the center of cam shaft 104. Cantilever portion 136 of respective terminal 110 extends between and past opposed apices 190,192 and has an outwardly facing side 194 associated with outer land 186 and an inwardly facing side 196 associated with inner land 188. Outer land 186 includes a first cam surface 198 facing outwardly facing side 194 of cantilever portion 136' first cam surface 198 engaging outwardly facing side 194 at least upon cam actuation to deflect cantilever portion 136 inwardly to move terminal free end 138 into card-receiving channel 118 for second contact section 116 disposed thereon into engagement with a corresponding contact section 58 of the daughter card. Inner land 188 includes a second cam surface 200 disposed adjacent inwardly facing side 196 of cantilever portion 136 and is engageable therewith when cam shaft 104 is moved to the unactuated orientation to deflect and hold cantilever portion 136 outwardly to remove free end 138 from channel 118, disengaging the contact sections and permitting withdrawal of the daughter card from channel 118.

Figure 9:
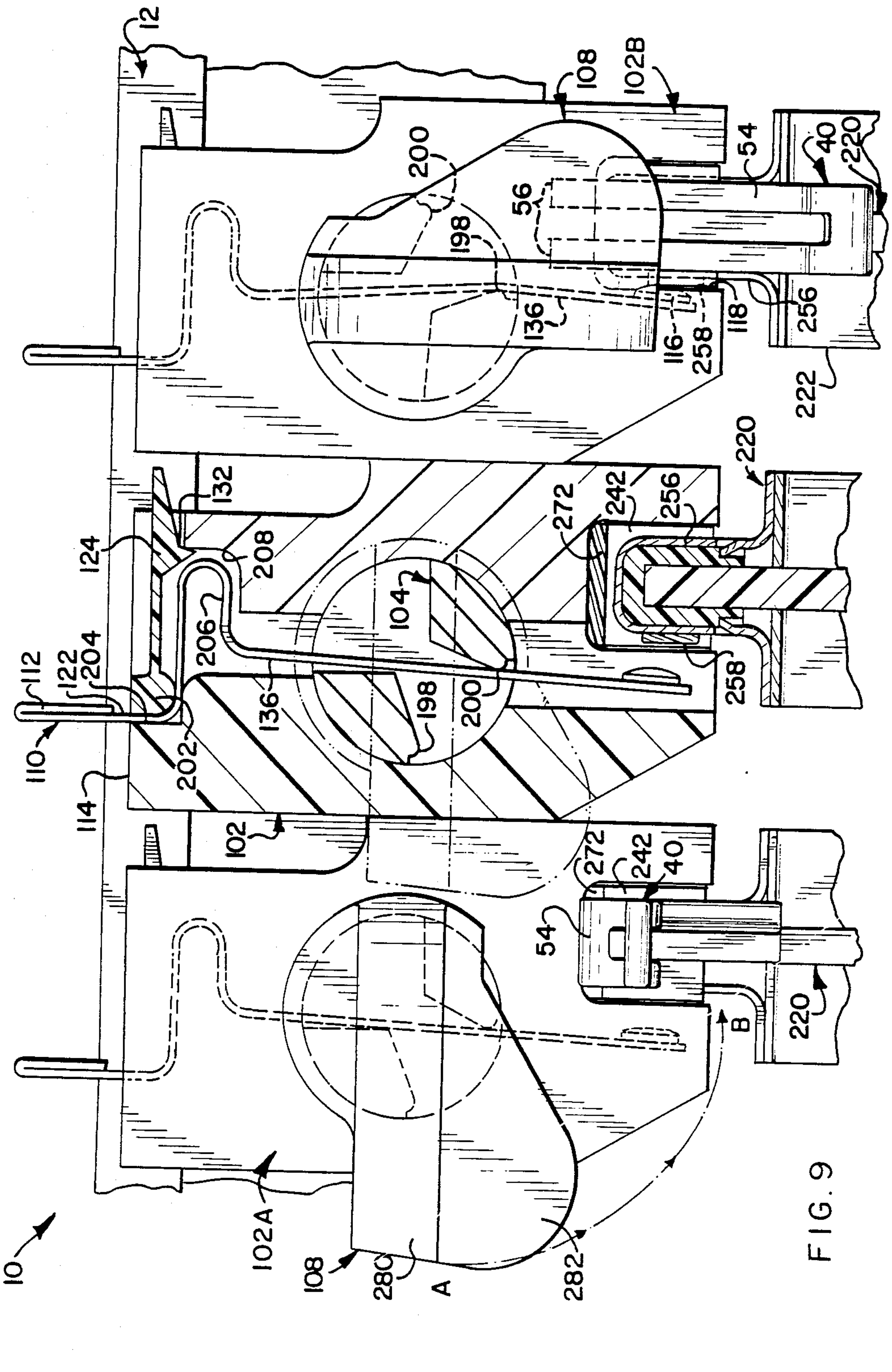
FIG. 9 shows actuation of the edge guide power connector and illustrate the camming of an edge guide power terminal into engagement with a terminal of the card.

Referring to FIGS. 5 and 9, end section 202 of mounting member 124 pins terminal mounting section 122 against surface 204 of housing 102. A looped section 206 of terminal 110 is contained in a relief area 208 of aperture 120 to facilitate flexing and relieve stress on the mounting joint when cantilever portion 136 depending therefrom is deflected between an electrically engaged state and a disengaged state by first and second cam surfaces 198,200 of cam shaft 104.

The use of first and second cam surfaces 198,200 provides positive deflection of cantilever portion 136 for controlled continuously applied force on terminal 110 and results in assured contact engagement of second contact section 116 with the corresponding contact means of the daughter card when actuated, and assured clearance from channel 118 when unactuated. Outer and inner lands 186,188 each extend over an angular distance of between about 90 degrees and 120 degrees and first and second cam surfaces 198,200 preferably comprise radiussed corners of the lands. Terminals 110 preferably are aligned in a single row such that cantilever portions 136 thereof may be deflected in a common direction toward a coplanar array of contact means along a common side of the active edge of the daughter card, upon actuation by first cam surfaces 198, with second contact sections 116 facing card-receiving channel 118. While it may be preferred to cam the cantilever beams of power terminals 110 simultaneously into and out from electrical engagement with the daughter card contact sections 58, it is sometimes preferable to cam the cantilever portion of return terminals 110R before the others, and disengage return terminals 110R last, or to power a selected component first and disconnect it last, utilizing a terminal similar to terminal 110R. Contact section 116R of terminal 110R is raised or higher than contact sections 116 of the other terminals, thus physically engaging its corresponding contact section of daughter card 14 first upon actuation, and disengaging last upon deactuation.

Terminals 110 can be stamped and formed of low resistance high copper content alloy such as Copper alloy No. C-197 sold by Olin Corporation, and second contact sections 116,116R are preferably buttons of low resistance silver or silver alloy fastened thereto such as by soldering, inlaying or riveting. Housing 102 can be molded of for example material such as glass-filled thermoplastic polyester resin, as may be cam shaft 104, actuator member 108 and mounting members 124, while mounting block 142 may be metal.

Figure 10:
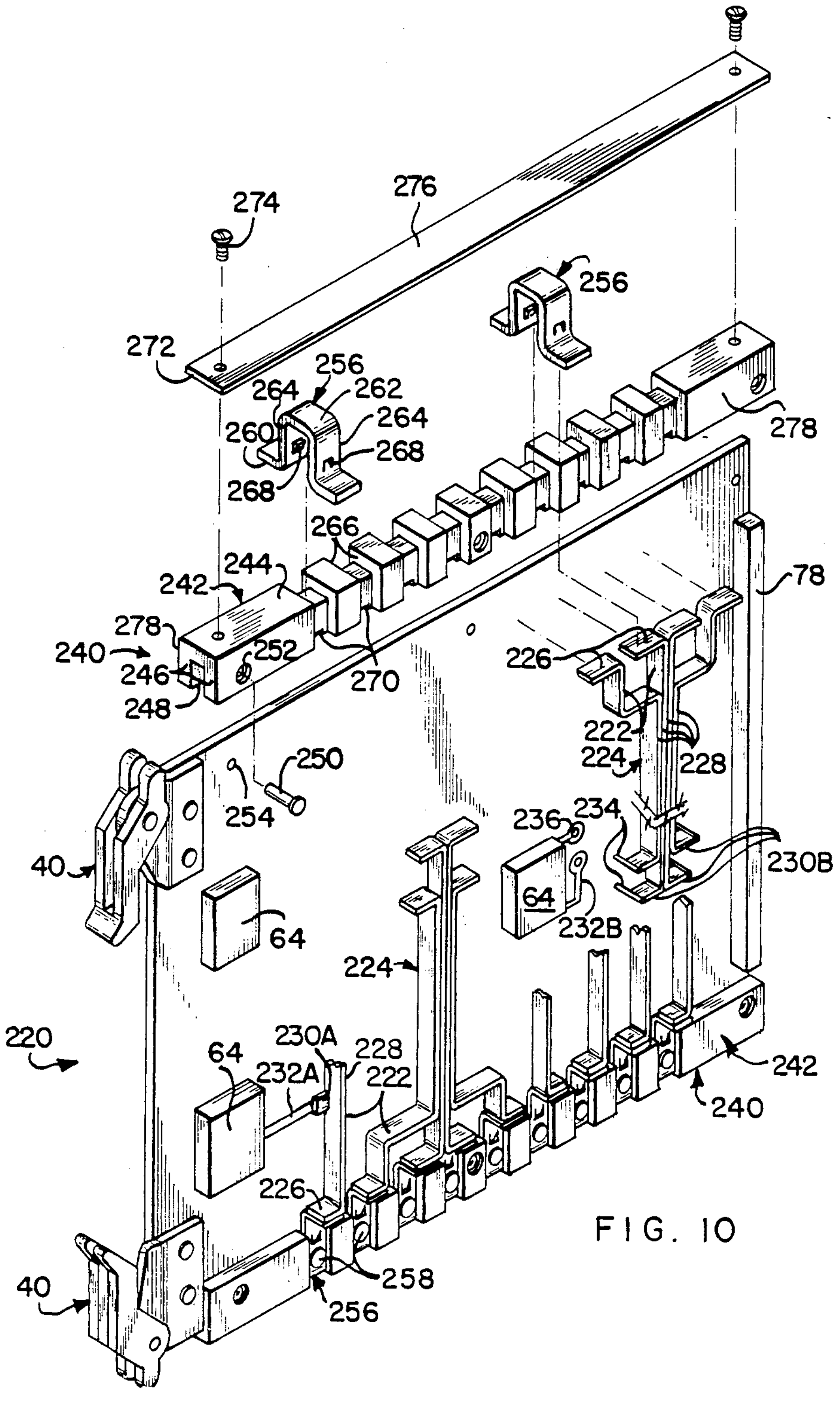
FIG. 10 is a perspective view of the loaded circuit card of the present invention, showing a second embodiment of the daughter card rail and showing power buses thereof, with one of the rail assemblies and a representative terminal exploded from an edge of the card and one of the power bus assemblies exploded from a surface of the card.

The active edge portion of daughter card shown in FIGS. 8 and 9 is of the embodiment shown in greater particularly in FIG. 10. Daughter card assembly 220 is usable with edge guide power connector 100, as is daughter card assembly 14 of FIG. 2. Daughter card assembly 220 is disclosed in U.S. patent application Ser. No. 07/127,746 filed Dec. 2, 1987 and assigned to the assignee hereof. In assembly 220 power may be transmitted from each active edge to a component 64 by means of power bus members 222 which are preferably grouped into power bus assemblies 224 to preserve surface area of the circuit panel for mounting of components. The bus members 222 may be joined to each other to form assembly 224 such as by using MYLAR tape, a product of E. I. DuPont de Nemours, Inc., which tape is coated on both sides by a heat sensitive adhesive which is cured. Each power bus member 222 includes a first termination section 226 at the active edge, a body section 228, and a second termination section 230A,230B in the interior of the major side surface 34,34' of the daughter card to be electrically connected to a power circuit path segment 232A,232B respectively of the daughter card to which the component is also electrically connected.

The second termination section of each power bus member 222 may be either a second termination section 230A which is surface mounted to a circuit path segment 232A of the daughter card such as by soldering or a second contact section 230B including a pin section 234 joined to power bus 222 and inserted into and soldered within a plated through-hole 236 of a power circuit path 232B. Each power bus member 222 may be coated with an insulative covering except at the termination sections such as with insulative varnish, and preferably are rigid bars of for example 0.02 inches thick and 0.25 inches high of an appropriate conductive alloy such as ASTM B-152 high copper content alloy. Such bus members have a conductive mass substantial enough to carry currents of levels of ten amperes or higher as desired, significantly higher than that carried by conventional etched circuit paths of circuit panels.

Most preferably each bus member 222 has at least two portions extending generally perpendicularly to their longitudinally extending body sections 228, for stability when disposed on edge on the daughter card. To conserve the amount of surface area on the side surface of the circuit panel, power bus members 222 are preferably mounted along the card's surface on edge, with the widths thereof extending a distance outwardly from the surface instead of along the surface. Power bus members are preferably elevated above the surface of the circuit panel by their termination sections, and they may also be insulated. As a result they may pass over signal paths on the surface of the daughter card until they reach their intended termination point in the interior of the card, greatly enhancing the utilization of the card's valuable real estate for signal transmission, without resort to the use of multilayer daughter cards and the costly fabrication process involved therewith, just to provide for bussing of power from the edge to the interior without interfering with signal circuit paths.

Along each active edge of the daughter card in FIG. 10 is a connector rail assembly 240 comprising a profiled dielectric rail member 242 having a body section 244 inwardly from which extend a pair of opposed pair of flanges 246 defining a card-receiving groove 248 therebetween. Rail 242 is mounted on the active edge of the card with the top (or bottom) side edge of the daughter card secured in card-receiving groove 248, such as by the use of rivets 250 extending through aligned countersunk holes 252 of the flanges 246 and holes 254 of the daughter card. A plurality of terminals 256 are contained in rail assembly 240, and each terminal 256 includes a contact section 258 (FIG. 9) to be electrically engageable by a corresponding contact means of the edge guide power connector, and termination sections 260 electrically connected to first termination sections 226 of two respective power bus member 222 (one on each side of card 220), such as by soldering or welding, or optionally by using spring clips (not shown) of stainless steel which can be removed if desired for servicing and repair of the daughter card.

Each terminal 256 has a top horizontal section 262 and two vertical sections 264 depending therefrom and disposed within recesses 266 of rail member 242. Terminal 256 may be mounted to rail 242 such as by using locking lances 268 on vertical sections 264, which lock behind stop surfaces 270 of rail 242. Then a dielectric cover member 272 is preferably secured along the top surface of rail member 242, fastened thereto by a plurality of screws 274 spaced periodically therealong, with cover member 272 covering horizontal sections 262 of terminals 256. Power bus members 222 can be securable to the daughter card by the joints with terminals 256 of the connector rail and by pin sections 232 soldered in plated through-holes 234 of power circuit paths 236. Power bus assemblies 224 can be joined together such as by bonding the body sections of individual bus members 222 such as with the double-sided MYLAR tape as explained above.

As with rail 32 of daughter card 14 of FIGS. 2 and 3, rail assembly 240 of FIG. 10 preferably has rectilinear outwardly facing top 276 and side 278 surfaces suitable to be bearinq surfaces for insertion into the correspondingly shaped channel of the edge guide power connector. Being recessed below top surface 276 and side surfaces 278, terminals 256 do not interfere with insertion of daughter card assembly 220 into channels of the power connectors. Rails 242 and 32 both provide substantial resistance to the tendency of daughter cards to warp over the substantial length of their side edges 36,36'. Terminals 256 may be formed of ASTM B-152 copper alloy, for example, with contact sections 258 preferably being buttons of silver or silver alloy soldered onto vertical sections 264. Rail and mounting members 242,272 may be molded of glass-filled thermoplastic polyester resin. The insertion/ejection members may be the same as those shown in FIG. 2A, or may be like those of FIG. 4B, both of which operate in similar manners during insertion and ejection.

Close control over contact engagement and the application of contact normal force can be maintained, given the coupling of the edge guide power connector and the daughter card's active edge, by careful assembly of the power connector and by fabrication of the rail member so that contact surfaces of the contact sections along the side of the circuit panel are maintained a selected incremental distance from the level of the outer side surface of the rail. This can be accomplished by standardizing the thickness of the rail's flange along the contact section side, allowing the opposite flange to be varied in thickness according to the thickness of the particular circuit panel substrate with which the rail is to be used, which still maintains a standardized overall width to the rail member so that power connectors and their channels can be manufactured with common dimensions and still accommodate a variety of circuit panels.

In order to assure that power is not transmitted to the active edge of the daughter card prior to the card being locked in position, it is preferred that a physical interference occur between insertion/ejection member 40 of the daughter card and the actuator of the power connector which prevents moving the actuator into its actuating position unless the insertion/ejection member is in its locked position. Referring to FIGS. 6, 7, and 9, actuator 108 includes a hand-grippable portion 280 and a transverse portion 282. In FIG. 9, actuator 108 of connector 102A at left is in position A or the unactuated position with hand-grippable portion 280 disposed horizontally and extending toward the left. Position B or the actuated position is shown where the hand-grippable portion would be vertical or downward, as with connector 102B at right. Hand-grippable lever portion 54 of insertion/ejection member 40 in FIGS. 7 and 9 (at left) is in the unlocked or open state and extends out forwardly of the daughter card.

In order for actuator 108 to be rotated 90 degrees for actuation, transverse portion 282 would have to be moved in a path intersecting the position of lever portion 54 of insertion/ejection member 40 in its open state. In FIG. 9 insertion/ejection member 40 associated with connector 102B at right has been moved to its locked state and lever portion 54 is now vertical along the front edge of daughter card 220 (FIG. 6), which provides clearance for transverse portion 282 so that actuator 108 can be moved to position B. Locking protrusions 56 (in phantom in FIG. 9 at right) are shown in locking position within locking aperture 284 of power connector 100 (FIG. 6).

The interference system also requires that actuator 108 be positioned in its unactuated position A in order for the daughter card to be either inserted into or withdrawn from the channel of the power connector, thus assuring that the cantilever portions of all the terminals of the power connector are clear of the channel and their free ends disposed in the respective recesses. When actuator 108 is in position B, transverse portion 282 is disposed in front of rail assembly 240 of the daughter card and blocks insertion/ejection lever portion 54 from being rotated upwardly to unlock and eject the daughter card from the card cage.

Figure 11:
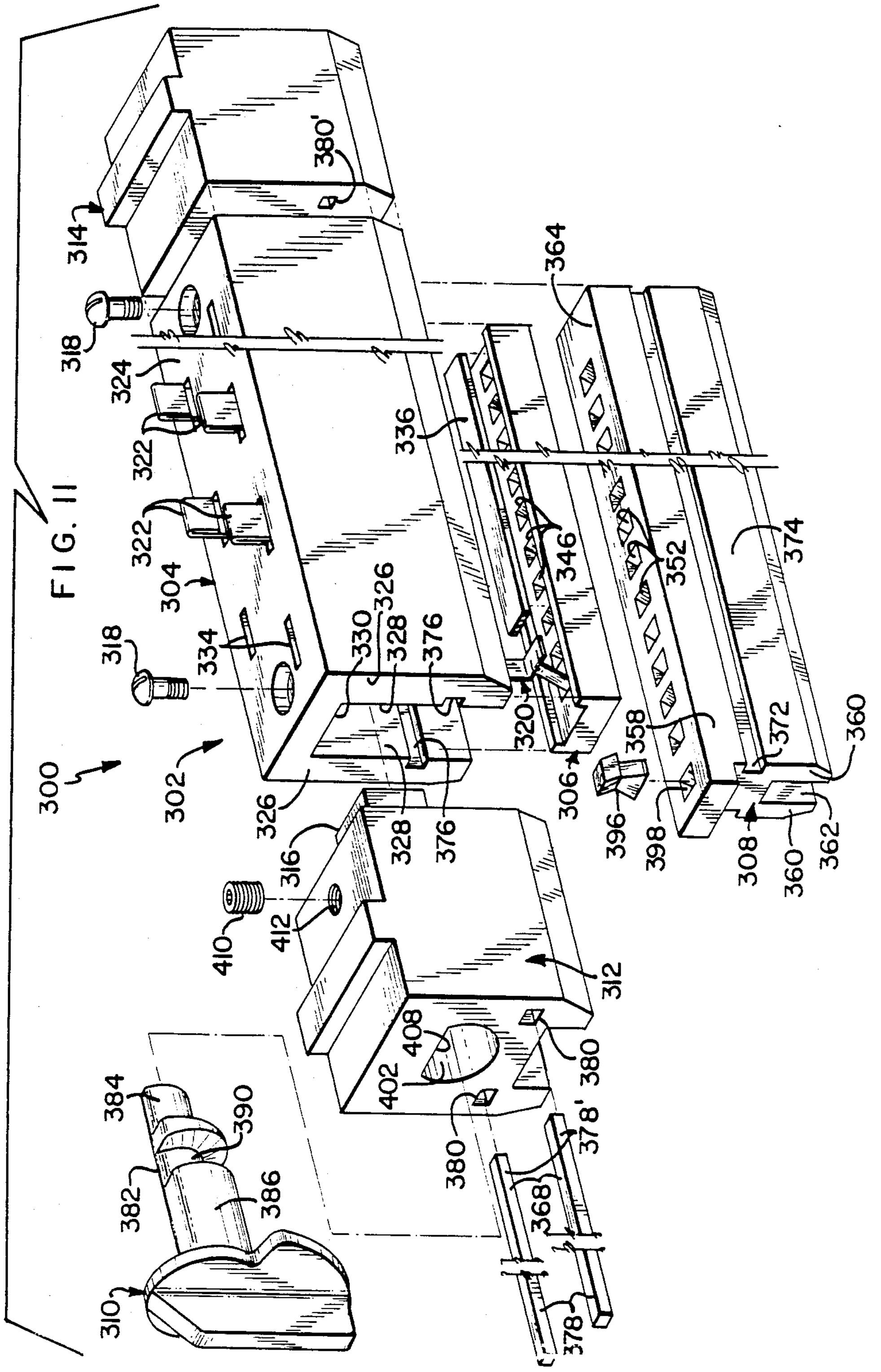
FIG. 11 is an exploded perspective view of another power connector embodiment having a linearly movable cam shaft.
Figure 12:
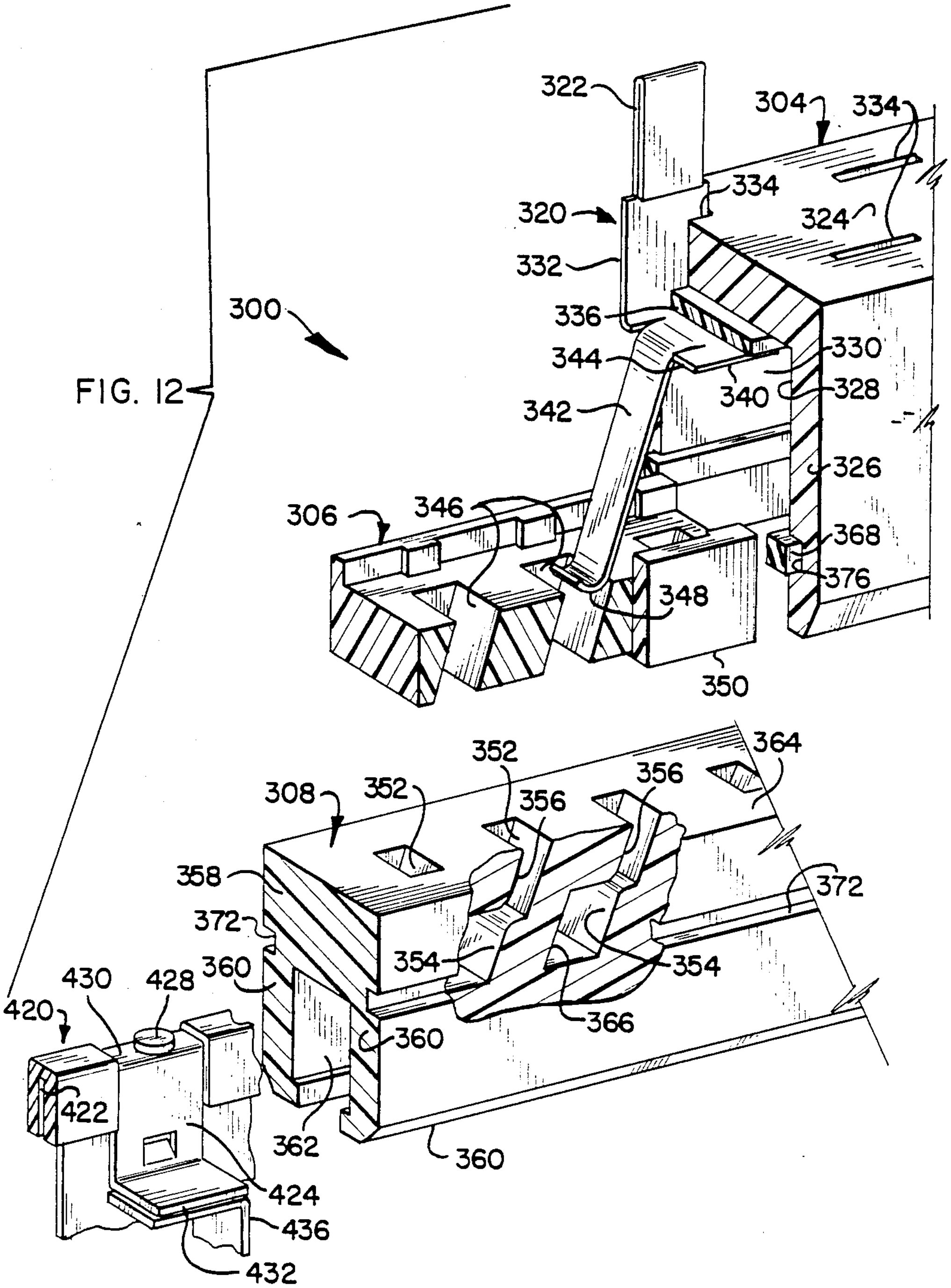
FIG. 12 is an enlarged exploded part cross section of the power connector of FIG. 11 showing a terminal and its housing and cam shaft apertures, with a card edge section exploded from the channel.
Figure 13:
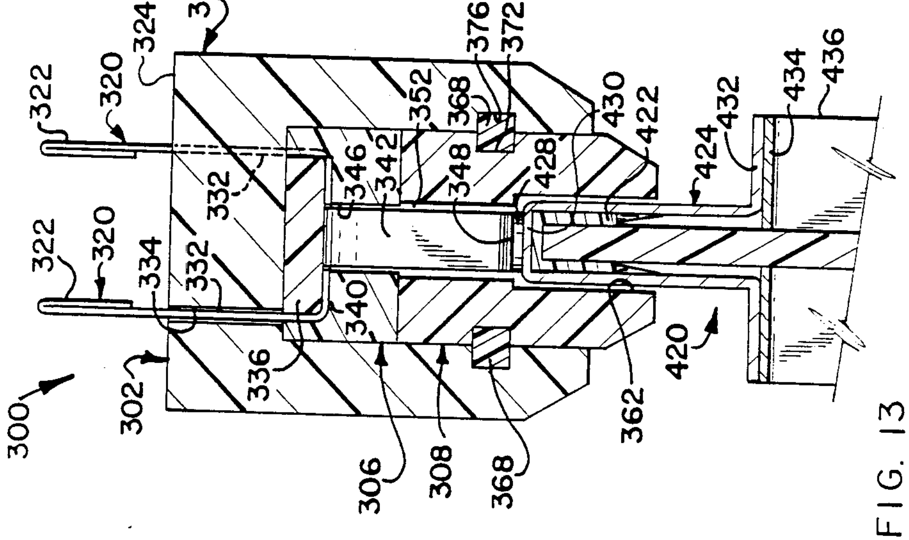
FIG. 13 is a cross sectional view of the daughter card in the channel of the power connector of FIG. 11 and a terminal engaged with a card contact section.

FIGS. 11 to 17 illustrate a second embodiment 300 of edge guide power connector, one having a linear motion cam shaft, as disclosed in U.S. patent application Ser. No. 07/127,148 filed Dec. 2, 1987 and assigned to the assignee hereof. Connector 300 includes a housing assembly 302 including a first or upper housing member 304, a second or middle housing member 306, cam shaft or member 308 comprising the bottom portion of housing assembly 302, actuator 310 secured a forward housing member 312, and rearward housing member 314. Forward housing member 312 includes a lug 316 insertable into a forward end of upper housing member 304, allowing securing to the upper housing member by a self-tapping screw 318 into a corresponding insert 318A in lug 316 (FIG. 13). Rearward housing member 314 is similarly securable to a rearward end of upper housing member 304. Connector 300 also includes a plurality of terminals 320 having respective first contact sections 322 extending upwardly from cable face 324 to be engageable by corresponding terminal means of power and return conductor means (FIG. 1) of the card cage. Upper housing member 304 includes a pair of depending flanges 326 having inwardly facing surfaces 328 forming cam-receiving channel 330, within which are disposed middle housing member 306 and cam shaft 308 upon assembly. Terminals 320 may have their first contact sections 322 disposed in two rows along cable face 324, if desired.

Referring to FIG. 12, vertical mounting section 332 of each terminal 320 extends through a vertical passageway 334 of upper housing member 304. An insert member 336 is disposed between lower surface 338 of upper housing member 304 and horizontal body section 340 of terminal 320, and middle housing member 306 holds horizontal body section 340 against insert 336. Spring arm 342 of terminal 320 extends downwardly from forward side edge 344 of horizontal body section 340 and forwardly at an angle through an angled opening 346 of middle housing member 306. Spring arm 342 extends to a free end 348 below lower surface 350 of middle housing member 306 into and through a corresponding angled opening 352 of cam shaft 308 defined by forwardly facing surface 354, rearwardly facing surface 356 and side surfaces. Cam shaft 308 has a body section 358 downwardly from both sides of which depend opposing spaced flanges 360 defining card-receiving channel 362. Each angled opening 352 extends from upper surface 364 of cam shaft 308 to channel 362 to be in communication therewith so that free end 348 can be deflected into channel 362 to engage a contact section of a corresponding terminal of the daughter card disposed along channel 362. Each angled opening 352 includes a recessed portion 366 in which arcuate-shaped free end 348 is disposed when not deflected into channel 362.

As shown in FIGS. 11 and 13, a pair of retention rails 368 provide a means for cam shaft 308 to be moved linearly with respect to the remainder of housing assembly 302, along lower surface 370 of middle housing member 306. Rails 368 are received along channels 372 on outer side wall surfaces 374 of body section 358 of cam shaft 308 paired with and facing opposed channels 376 along inwardly facing surfaces 328 of flanges 326 depending from upper housing member 304. Rail ends 378,378' are held in passageways 380,380' of forward and rearward housing members 312,314 respectively.

FIGS. 12 and 13 illustrate one embodiment 420 of daughter card the active edge of which includes a dielectric rail 422 secured thereto by periodically placed rivets (not shown) and including a plurality of terminal members 424 mounted in shallow recesses 426 therealong. Each terminal member can extend recessed along one or both side surfaces of rail 422 and recessed across the top surface, and includes a contact section 428 preferably a button of silver or silver alloy soldered along the terminal's top surface 430 to be engaged by arcuate-shaped free end 348 of terminal 320 of power connector 300 when actuated. Terminal 424 has at least one termnation section 432 soldered or welded or clipped to a corresponding termination section 434 of a power bus member 436 of the card, or alternatively electrically joined to a circuit path of the card. Mounting of terminal 424 can be by a pair of locking lances 438 engaging stop surfaces 440 on both sides of rail 422.

Figure 16:
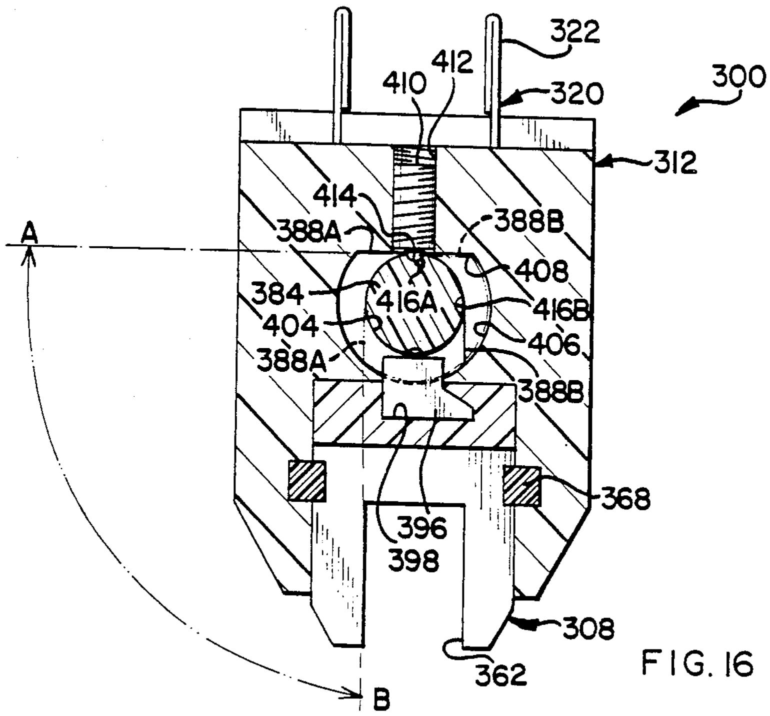
FIG. 16 is a cross sectional view through the forward end of the assembled connector of FIG. 11 showing the actuator in an unactuated position, with the actuated position in phantom, and the follower member in position.
Figure 14:
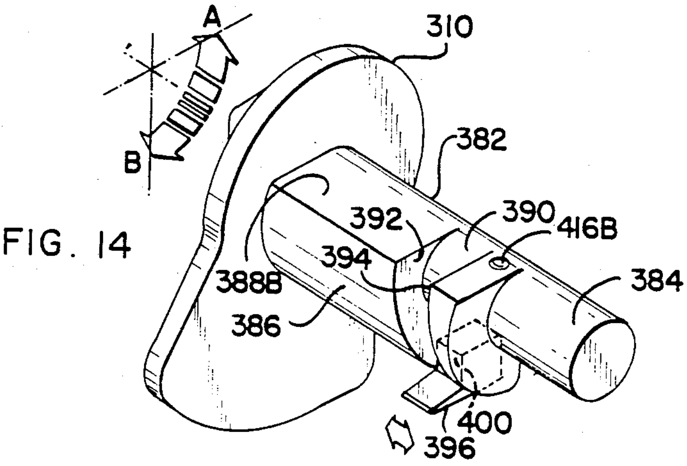
FIG. 14 is a rear perspective view of the rotary actuator of the power connector of FIG. 11, with a follower member in the actuator's helical groove.
Figure 15:
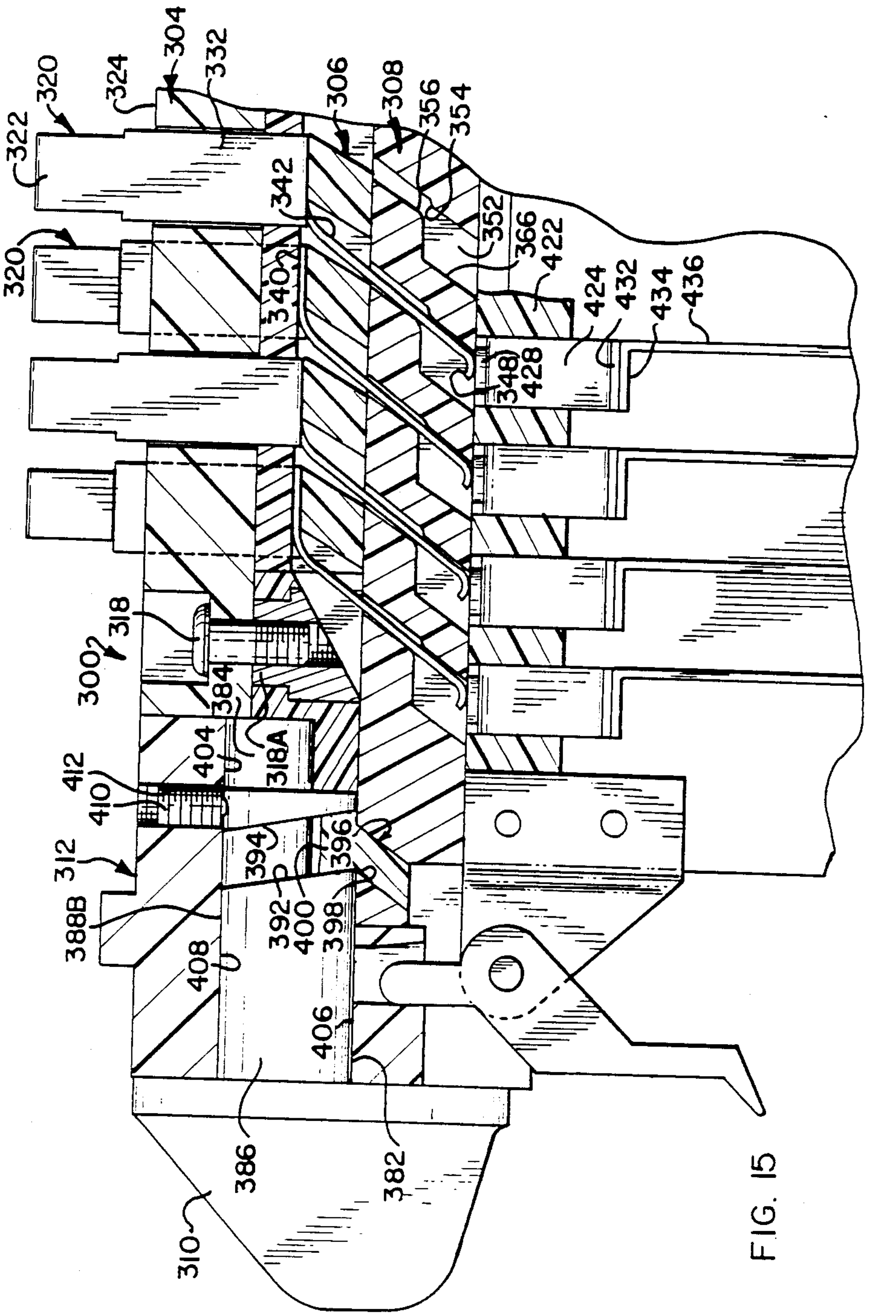
FIG. 15 is a part longitudinal section view of the power connector of FIG. 11 showing the relationship of the rotary actuator and the cam shaft, with a daughter card locked in position.

Actuator 310 as shown in FIGS. 14 and 15 includes a profiled shaft 382 having a smaller diameter end portion 384. Forward portion 386 has a cross section shaped generally like a quarter-cylinder with flattened side surfaces 388A,388B tangential with end portion 384 at the inner corner of the quarter-cylinder. Defined in forward shaft portion 386 is a helical groove segment 390 having opposed wall surfaces 392,394. Follower member 396 is disposed in cavity 398 at the forward end of cam shaft 308 along top surface 364 thereof, and includes a boss 400 extending upwardly into helical groove segment 390. Actuator 310 is secured to forward housing member 312 with its profiled shaft 382 within a profiled bore 402 of forward housing member 312. Profiled bore 402 includes a smaller diameter bore portion 404 associated with end portion 384 of actuator shaft 382, and a larger dimensioned profiled portion 406 associated with forward shaft portion 386 of actuator 310. Profiled bore portion 406 has a flat chordal surface 408 which gives it generally a semicylindrical shape and which serves as a stop defining unactuated position A and actuated position B for actuator 310 as shown in FIG. 16, when engaged by flattened surfaces 388A,388B of forward shaft portion 386 as actuator 310 is rotated during actuation and deactuation of connector 300.

With follower member 396 held in cavity 398 of cam shaft 308, and boss 400 thereof disposed within helical groove segment 390, as actuator 310 is rotated from unactuated position A to actuated position B, rearwardly facing wall surface 392 bears against boss 400 and moving follower 396 and cam shaft 308 rearwardly and translating rotational movement into linear motion, until flattened shaft surface 388B abuts chordal surface 408 of profiled bore 402 of forward housing member 312. Conversely, as actuator 310 is moved to its unactuated position A, forwardly facing wall surface 394 of helical groove segment 390 bears against boss 400 moving follower member 396 and cam shaft 308 forwardly, until flattened shaft surface 388A abuts chordal surface 408. It may be desired to utilize a detent assembly 410 threadedly secured within hole 412 so that detent 414 can be received into a first cavity 416A corresponding to unactuated position A or a second cavity 416B corresponding to actuated position B to retain actuator 310 in the selected position.

Figure 17:
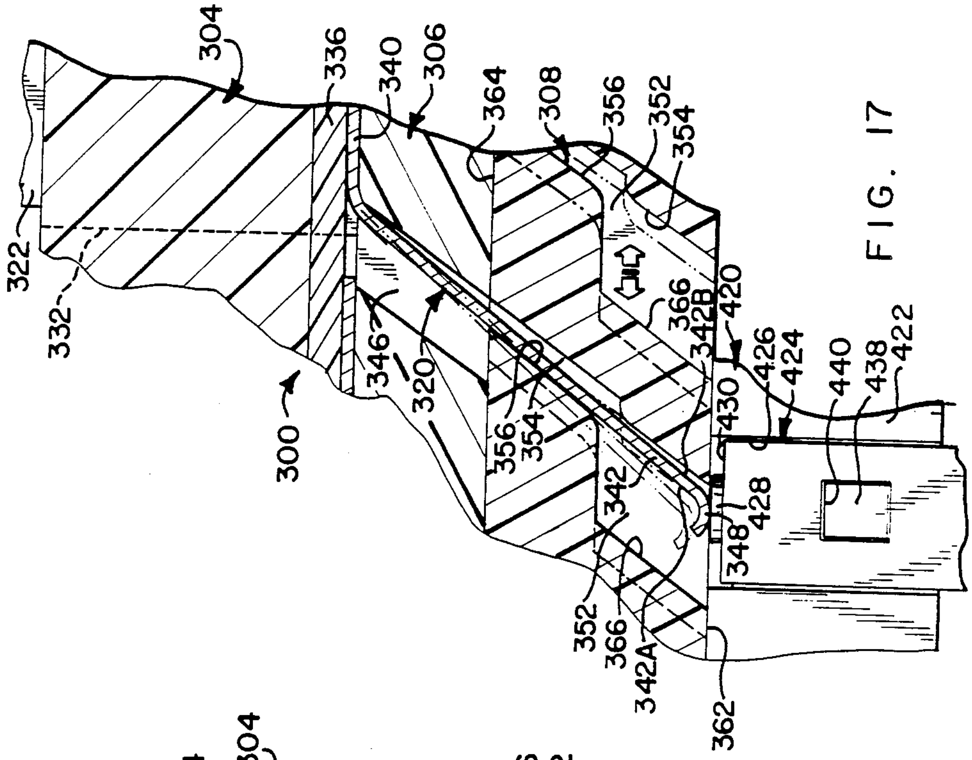
FIG. 17 is an enlarged longitudinal section view showing a terminal of the power connector of FIG. 11 cammed in an actuated position, and in a deactuated position (in phantom).

Referring to FIG. 17, when cam shaft 308 is moved rearwardly during actuation, rearwardly facing surface 356 of angled opening 352 of cam shaft 308 engages the front side 342A of spring arm 342 of terminal 320 and deflects it downwardly and rearwardly so that free end 348 is rotated into channel 362. Surface 356 holds free end 348 under tension against contact section 426 of daughter card 420 to establish a desired continuous contact normal force, which action incidentally creates a wiping action along the contact surfaces to break up oxides which typically form. When cam shaft 308 is moved to an unactuated position, forwardly facing surface 354 engages back side 342B of spring arm 342 and urges it forwardly and upwardly into recess 366 where it continuously holds it away from daughter card terminal 424 and clear of channel 362.

What is claimed is:

1. An assembly of a circuit panel and an electrical connector mounted on a frame of a card cage opposed from cooperating card-receiving means of the frame, the electrical connector having electrical connection means electrically connected respectively to power conductor means and to return conductor means and further being electrically connectable to contact means along an active edge of the circuit panel to provide and distribute electrical power to the circuit panel to power a plurality of electrical components secured to the circuit panel in electrical connection with power and return bus means thereof, comprising:

said card cage having said frame, said power conductor means and said return conductor means and adapted to contain at least said one circuit panel insertable into an open side thereof and removable therefrom along opposed parallel card-receiving means, said at least one circuit panel having opposed major side surfaces and including opposed parallel edge surfaces, and a power connector associated with an active edge of each said at least one circuit panel mounted on said card cage frame opposed from and parallel to a cooperating said card-receiving means, said connector including a card-receiving channel extending therealong parallel to a card-receiving channel of said card-receiving means of said frame where both said channels extend into said card cage from open ends thereof at said open card cage side, wherein:

(A) said circuit panel includes a rigid dielectric substrate, at least one of said major side surfaces including power bus means and return bus means, said substrate having at least one edge portion selected to be an active edge and having extending proximately thereto said power and return bus means, each eaid power and return bus means being adapted to conduct electrical power of desired current levels therealong; and a profiled dielectric rail member is secured along each said active edge and adapted to be inserted into said card-receiving channel of said connector, each said rail member havng a longitudinally extending body section and opposed flange sections extending from one side thereof defining an edge-receiving groove, said flange sections extending inwardly along portions of both major side surfaces of said substrate, said rail member having surfaces facing outwardly away from said major side surfaces and said active edge of said substrate, and said outwardly facing surfaces including a plurality of recesses thereinto exposing respective contact sections of said power and return bus means;

(B) said power connector comprises:

housing means secured to said frame and extending into said card cage from said open side thereof, said housing means including said card-receiving channel, a cam-receiving aperture parallel to said channel, and a plurality of terminal-receiving passageways each including at least a first portion transverse to said channel and in communication therewith and further including a second portion in communication with said cam-receiving aperture;

a plurality of connector terminal members secured within respective said terminal-receiving passageways of said housing means associated with corresponding power and return bus means of said ciru-cit panel, each said connector terminal member having a movable portion including a first contact section proximate said channel for electrical engagement with a said contact section of a corresponding said power or returen bus means, and further having a second contact section remote from said channel and electrically connected to a said power or return conductor means; and camming means secured within said cam-receiving aperture of said housing means in a manner permitting reciprocal movement therewithin between an unactuated orientation and an actuated orientation, said camming means including actuating means exposed for actuation at the end of said housing means disposed along said open card cage side;

said camming means including camming sections engageable with cam-engaging sections of said connector terminal members through said second passageway portions upon actuation of said camming means, said camming means upon actuation urging said movable portions of said plurality of terminal members toward and into said card-receiving channel to electrically engage corresponding said contact sections of said power and return bus means;

(c) whereby said circuit panel is insertable into said card cage from said open side along side connector and said cooperating card-receiving means with said opposed edge surfaces following said opposed channels, including said active edge being insertable into said connector channel, and said connector terminal members then being movable by said camming means upon actuation thereof into respective said recesses to electrically engage respective said power and return bus means to bring electrical power to said electrical components, and said connector terminal members being electrically disengaged from said power and return bus means and movable out of said recesses and from said channel upon said camming means being moved to said unactuated orientation to clear said channel and permit removal of said circuit panel from said card cage.

2. An assembly as set forth in claim 1 wherein a back edge of said circuit panel includes other electrical connector means therealong electrically connected to other circuit paths of said circuit panel and electrically matable with corresponding connector means secured to a backplane across an inner end of the card-receiving area of said card cage, said corresponding connector means being disposed transverse to and between said connector and said cooperable card-receiving means when said circuit panel is inserted into said card cage along said opposing card-receiving channels.

3. An assembly as set forth in claim 1 wherein said card cage includes a plurality of like said connectors in parallel and opposed from respective said cooperable card-receiving means, whereby said card cage is adapted to receive a like plurality of like said circuit panels thereinto.

4. An assembly as set forth in claim 1 further including at least one means for securing said circuit panel within said card cage, said securing means being fastened to one of said connector and said frame and said circuit panel and being disposed proximate said card-receiving channel end at said open side of said card cage at least after said circuit panel has been inserted thereinto, said securing means being adapted to be movable to secure said circuit panel in said card cage in cooperation with corresponding securing means of another of said connector and said frame and said circuit panel.

5. An assembly as set forth in claim 4 wherein said securing means is a lever pivotally mounted on said circuit panel at a front end of said active edge and pivotable within a plane parallel to the plane of said circuit panel from an unlocked position wherein an operator-accessible end thereof extends outwardly from said circuit panel to a locked position wherein said operator-accessible end extends along a front edge of said circuit panel, said lever including a remote protrusion movable into card-securing engagement within a corresponding recess in said connector upon said lever being pivoted to said locked position.

6. An assembly as set forth in claim 1 wherein said second contact sections of said connector terminal members comprise blade-like tab sections extending outwardly from a common side of said housing means for electrical engagement with corresponding terminal means of said power and return conductor means.

7. An assembly as set forth in claim 1 wherein said circuit panel includes a second active edge opposed from said active edge, said second active edge having a like said rail member secured thereto having a plurality of like said contact means secured in recesses thereof similarly electrically connected to respective power and return bus means, enabling said circuit panel to be disposed between two opposing said connectors secured to said card cage frame with said active edges slidable along opposed respective channels of said connectors to hold said substrate in said card cage.

8. An assembly as set forth in claim 1 wherein said contact means of said power and return bus means of said circuit panel are disposed in a coplanar array along a common side of said active edge, and said movable portions of said connector terminal members are mounted to be deflected in a common direction toward said coplanar array upon actuation by said first cam surfaces of said camming means being appropriately positioned, with said first contact sections of said connector terminal members facing said common direction to engage said contact means of said power and return bus means opposed therefrom.

9. An assembly of a circuit panel and an electrical connector mounted on a frame of a card cage opposed from cooperating card-receiving means of the frame, the electrical connector being electrically connected to power and return conductor means and further being electrically connectable to the circuit panel to provide and distribute electrical power to the circuit panel to power a plurality of electrical components secured to the circuit panel in electrical connection with power and return bus means thereof, comprising:

said card cage having said frame and adapted to contain at least one said circuit panel insertable into an open side thereof and removable therefrom along opposed parallel said card-receiving means;

said at least one circuit panel having opposed major side surfaces and including opposed parallel edge surfaces at least one of which is selected to be a active edge, said circuit panel having extending proximately thereto said power and return bus means, and exposed contact means along said active edge electrically connected to said power and return bus means; and a power connector associated with each said active edge of each said at least one circuit panel mounted on said card cage frame opposed from and parallel to a cooperating said card-receiving means, said connector including a card-receiving channel extending therealong parallel to a card-receiving channel of said card-receiving means of said frame where both said channels extend into said card cafe from open ends thereof at said open card cage side, said connector including a plurality of terminal means electrically connected to power and return conductor means and engagfeable with said exposed contact means of said circuit panel, said connector including means actuatable to provide power to said circuit panel;

said circuit panel including at least one securing member movably mounted thereon cooperable with corresponding securing means of one of said connector and said card cage to secure said circuit panel in said card cage upon full insertion thereinto;

said securing member and said actuating means being so arranged and adapted such that during actuation of said actuating means a portion thereof follows a path which intersects a path followed by a portion of said securing member when said securing member is moved to secure said circuit panel in said card-receiving channel of said power connector after circuit panel insertion into said card cage frame, whereby said actuation means cooperates with said securing member such that when said securing member has not been moved into a card-securing position and said circuit panel has not been locked in said card-receiving channel, said actuation means portion encounters said securing member portion and said actuating means is prevented from being moved to an actuating position, and when said actuation means has not been moved into an unactuated position and said terminal means and said corresponding power and return bus means remain electrically engaged said securing member portion encounters said actuation means portion and said curcuit panel is prevented from being removed from said card-receiving channel.

10. An electrical connector for distributing power to a circuit panel to a plurality of power-receiving locations along an active edge thereof, the connector having means for electrical connection to a plurality of power bus means and at least one return bus means of the circuit panel, the connector being mountable to a frame opposed from cooperating card-receiving means of the frame, and electrical connection means of the connector being electrically connectable to respective power and return conductor means, comprising:

housing means securaable to said frame, said housing means including surfaces defining a card-receiving channel into which an active edge of a circuit panel is insertable, a cam-receiving aperture parallel to said channel, and a plurality of terminal-receiving passageways each including at least a first portion in communication with said channel and further including a second portion in communication with said cam-receiving aperture;

a plurality of terminal members secured within respective said terminal-receiving passageways of said housing means associated with corresponding panel circuit path means along said active edge, each of said terminal members having a movable portion including a first contact section proximate said channel and disposed along a said channel-defining surface thereof for electrical engagement with a contact section of a said corresponding panel power or return bus means exposed for such engagement upon mating, and further having a second contact section remote from said channel and electrically connectable to a corresponding contact means of an electrical power conductor means or a return conductor means; and caming means secured within said cam-receiving aperture of said housing means in a manner permitting reciprocal movement therewithin between an unactuated orientation and an actuated orientation, said camming means including actuating means at an end of said housing means exposed for actuation;

said camming means including camming sections associated with respective said terminal members and engageable with cam-engaging sections of said terminal members through said second passageway portions upon actuation of said camming means, whereby said camming means upon actuation urges sqaid movable terminal portions of said plurality of terminal members toward and into said channel from at least one said channel-defining surface to electrically engage contact sections of corresponding said panel power or return bus means, and continues until deactuation to hold the terminal portions thereagainst under positively-applied force sufficient to assuredly generate contact normal force at a level appropriate for elelctrical connections carrying current at levels exceeding one ampere.

11. An electrical connector as set forth in claim 10 wherein a portion of said actuating means is disposed across said open end of said channel when said camming means is in said actuated orientation, preventing insertion of a said circuit panel into said channel when the connector is in an actuated state, and preventing withdrawal from said channel of a said circuit pane; already within said channel when the connector is in an actuated state.

12. A circuit panel for elelctrical connection of power and return bus means thereof along an active edge thereof to a plurality of terminal means of a corresponding actuatable electrical connector connected to power conductor means and return conductor means, to provide distributed electrical power to electrical components mountable on the circuit panel in electrical connection with the power and return bus means, the corresponding connector being of the type having its terminal means disposed along a channel along which the circuit panel is laterally movable from a channel entrance at one end thereof during mating of the circuit panel therewith, comprising:

a rigid dielectric substrate having a thickness, opposed major side surfaces, opposed leading and trailing edges and opposed lateral edges at least one said lateral edge selected to be an active edge and having said power and return bus means extending proximately thereto and each said power and return bus means including a respective contact section along said active edge; and a profiled dielectric rail member secured along each said active edge extending from said leading edge to said trailing edge and adapted to be received into said channel of said corresponding actuatable electrical power connector having said plurality of terminal means disposed therealong, each said rail member having a longitudinally extending body section and opposed flange sections extending from one side thereof defining an edge-receiving groove, said edge-receiving groove being dimensioned to receive thereinto said edge portion of said circuit panel substrate, said rail member having opposed outwardly facing side surfaces and defining raised planar bearing surfaces cooperable with channel-defining surfaces of said connector channel, at least an appropriate one of said side surfaces includes a plurality of recesses thereinto transversely of said body section exposing respective said contact sections of said power and return bus means for electrical engagement by corresponding terminal means of the power connector upon actuatio thereof, and the width of said rail member between said outwardly facing side surfaces being precisely dimensioned to correspond with a standardized width of the channel of the electrical power connector into and along which said active edge with said rail member thereon is to be inserted, whereby a circuit panel assembly is defined which is adapted for lateral insertion into the connector channel and both the active edge of the circuit panel and the contact sections therealong are protected during handling and insertion into and withdrawal from the channel of said connector, while lthe contact sections are exposed for electrical engagement by connector terminal means to bring distributed power to the circuit panel, and whereby the rail member can accommodate varying thickness of circuit panel substrates by modifying the width of the edge-receiving groove thereof according during manufacture, allowing the power connector to have a standardized width.

13. A circuit panel as set forth in claim 12 wherein said power and return bus means comprise circuit paths along at least one said major substrate surface and said contact sections comprise buttons of low resistance metal fastened to end portions of said circuit paths.

14. A circuit panel for electrical connection of power and return bus means thereof along an active edge thereof to a plurality of terminal means of a corresponding actuatable electrical connector connected to respective power conductor means or return conductor means, to provide distributed electrical power to electrical components mountable on the circuit panel in electrical connection with the power and return bus means, the corresponding connector being of the type having its terminal means disposed along a channel along which the circuit panel is laterally movable from a channel entrance at one end thereof during mating of the circuit panel therewith, comprising:

a rigid dielectric substrate having a thickness, opposed major side surfaces, opposed leading and trailing edges and opposed lateral edges at least one said lateral edge selected to be an active edge and having said power and return bus means extendidng proximately thereto;

a profiled dielectric rail member secured along each said active edge extending from said leading edge to said trailing edge and adapted to be received into said channel of said corresponding actuatable electrical power connector having said plurality of terminal means disposed therealong, each said rail member having a longitudinally extending body section and opposed flange sections extending from one side thereof defining an edge-receiving groove dimensioned to receive said edge of said substrate thereinto, said flange sections extending inwardly along both major side surfaces of said substrate, said rail member having surfaces facing outwardly away from said major side surfaces and said active edge of said substrate and defining raised planar bearing surfaces cooperable with wall surfaces of said connector channel, and said outwardly facing surfaces including a plurality of reesses thereinto transversely of said body section and extending continuously from along one of said flange sections across said body section and to and along the other of said flange sections; and a plurality of terminal members secured to each said rail member in respective said recesses thereof, each said terminal member comprising a metal member of substantial conductive mass enabling conduction of electrical power, each said terminal member having a first contact section joined to a corresponding contact section of a respective said power or return bus, and further having a second contact section comprising a portion of said terminal member exposed in said recess to be engaged by a corresponding terminal means of said corresponding conenctor upon mating engagement therewith, whereby a circuit panel assembly is defined which is adapted for lateral insertion into the connector channel and said active edge of said substrate is thereby protected by the rail member during lateral insertion into the channel of said connector, and contact sections of respective said terminal members secured on the rail member are protected during and do not interfere with lateral channel insertion and exposed to be electrically engaged by movable contact sections of the connector terminal means secured along the channel thereof upon being urged into respective said recesses by camming means of the corresponding connector and held against the contact sections therein under sufficient contact normal force, to bring distributed electrical power to said electrical components to be powered.

15. A circuit panel as set forth in claim 14 wherein said substrate includes a second active edge opposed from said active edge, said second active edge having a like said rail member secured thereto having a plurality of like said terminal members secured in recesses thereof similarly electrically connected to respective power and return buses, enabling said substrate to be disposed between two opposing said connectors secured to a frame of a card cage with said active edges slidable along opposed respective channels of said connectors from open ends thereof to hold said substrate in said card cage.

16. A circuit panel as set forth in claim 15 wherein said substrate further includes at least one means cooperable with corresponding means of one of said frame and said opposing connectors for securing said circuit panel in said card cage.

17. A circuit panel as set forth in claim 14 wherein a second dielectric member is secured to said rail member across said top surface thereof and across top sections of said terminal members extending across said top rail surface.

18. A circuit panel as set forth in claim 14 wherein each said terminal member includes opposed vertical sections extending downwardly along respective side surfaces of said rail member, each said vertical section including a lance which locks behind a downwardly facing stop surface of said rail member to secure said terminal member thereto.

* * * * *